(12) United States Patent
Mimura et al.

(10) Patent No.: US 11,626,302 B2
(45) Date of Patent: Apr. 11, 2023

(54) BONDING METHOD FOR CLEANING NON-BONDING SURFACE OF SUBSTRATE

(71) Applicant: Tokyo Electron Limited, Tokyo (JP)

(72) Inventors: Yuji Mimura, Koshi (JP); Hiroshi Maeda, Koshi (JP); Satoshi Nishimura, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 17/813,369

(22) Filed: Jul. 19, 2022

(65) Prior Publication Data

US 2022/0351987 A1     Nov. 3, 2022

Related U.S. Application Data

(62) Division of application No. 16/813,952, filed on Mar. 10, 2020, now Pat. No. 11,424,142.

(30) Foreign Application Priority Data

Mar. 13, 2019 (JP) .............................. JP2019-046314
Sep. 12, 2019 (JP) .............................. JP2019-166325

(51) Int. Cl.
| | |
|---|---|
| *H01J 9/48* | (2006.01) |
| *H01L 21/67* | (2006.01) |
| *H01J 37/36* | (2006.01) |
| *H01L 21/304* | (2006.01) |
| *H01L 21/66* | (2006.01) |

(Continued)

(52) U.S. Cl.
CPC .......... *H01L 21/67092* (2013.01); *B24B 7/00* (2013.01); *B24D 3/00* (2013.01); *B32B 37/00* (2013.01); *G06T 7/0008* (2013.01); *H01J 9/48* (2013.01); *H01J 37/32* (2013.01); *H01J 37/32009* (2013.01); *H01J 37/32798* (2013.01); *H01J 37/36* (2013.01); *H01L 21/187* (2013.01); *H01L 21/304* (2013.01); *H01L 21/67288* (2013.01); *H01L 22/12* (2013.01); *G06T 2207/30148* (2013.01)

(58) Field of Classification Search
CPC ........ H01L 21/67092; H01J 9/48; H01J 37/36
See application file for complete search history.

(56) References Cited

U.S. PATENT DOCUMENTS

2021/0242044 A1 * 8/2021 Mitsuishi .......... H01L 21/67092

FOREIGN PATENT DOCUMENTS

JP     2012-175043 A     9/2012

* cited by examiner

*Primary Examiner* — Joseph L Williams
(74) *Attorney, Agent, or Firm* — Pearne & Gordon LLP

(57) ABSTRACT

A bonding system includes a surface modifying apparatus configured to modify a bonding surface of a first substrate and a bonding surface of a second substrate; a surface hydrophilizing apparatus configured to hydrophilize the modified bonding surface of the first substrate and the modified bonding surface of the second substrate; a bonding apparatus configured to perform bonding of the hydrophilized bonding surface of the first substrate and the hydrophilized bonding surface of the second substrate in a state that the bonding surfaces face each other; and a cleaning apparatus configured to clean, before the bonding is performed, a non-bonding surface of, between the first substrate and the second substrate, at least one which is maintained flat when the bonding is performed, the not-bonding surface being opposite to the bonding surface.

9 Claims, 18 Drawing Sheets

(51) Int. Cl.
*G06T 7/00* (2017.01)
*H01L 21/18* (2006.01)
*H01J 37/32* (2006.01)
*B32B 37/00* (2006.01)
*B24B 7/00* (2006.01)
*B24D 3/00* (2006.01)

BONDING METHOD FOR CLEANING NON-BONDING SURFACE OF SUBSTRATE

CROSS-REFERENCE TO RELATED APPLICATION

This is a divisional application of U.S. patent application Ser. No. 16/813,952 filed on Mar. 10, 2020, which claims the benefit of Japanese Patent Application Nos. 2019-046314 and 2019-166325 filed on Mar. 13, 2019 and Sep. 12, 2019, respectively, the entire disclosures of which are incorporated herein by reference.

TECHNICAL FIELD

The various aspects and embodiments described herein pertain generally to a bonding system and a bonding method.

BACKGROUND

A bonding system described in Patent Document 1 is equipped with a surface modifying apparatus configured to modify bonding target surfaces of substrates; a surface hydrophilizing apparatus configured to hydrophilize the surfaces of the substrates which are modified by the surface modifying apparatus; and a bonding apparatus configured to bond the substrates having the surfaces which are hydrophilized by the surface hydrophilizing apparatus. In this bonding system, after the surfaces of the substrates are modified in the surface modifying apparatus by performing a plasma processing on the surfaces of the substrates, the surfaces of the substrates are hydrophilized in the surface hydrophilizing apparatus by supplying pure water onto the surfaces of the substrates. Then, in the bonding apparatus, the two sheets of substrates placed to face each other are bonded by a Van der Waals force and a hydrogen bond.

Patent Document 1: Japanese Patent Laid-open Publication No. 2012-175043

SUMMARY

In an exemplary embodiment, a bonding system includes a surface modifying apparatus configured to modify a bonding surface of a first substrate and a bonding surface of a second substrate; a surface hydrophilizing apparatus configured to hydrophilize the modified bonding surface of the first substrate and the modified bonding surface of the second substrate; a bonding apparatus configured to perform bonding of the hydrophilized bonding surface of the first substrate and the hydrophilized bonding surface of the second substrate in a state that the bonding surfaces face each other; and a cleaning apparatus configured to clean, before the bonding is performed, a non-bonding surface of, between the first substrate and the second substrate, at least one which is maintained flat when the bonding is performed, the not-bonding surface being opposite to the bonding surface.

The foregoing summary is illustrative only and is not intended to be any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
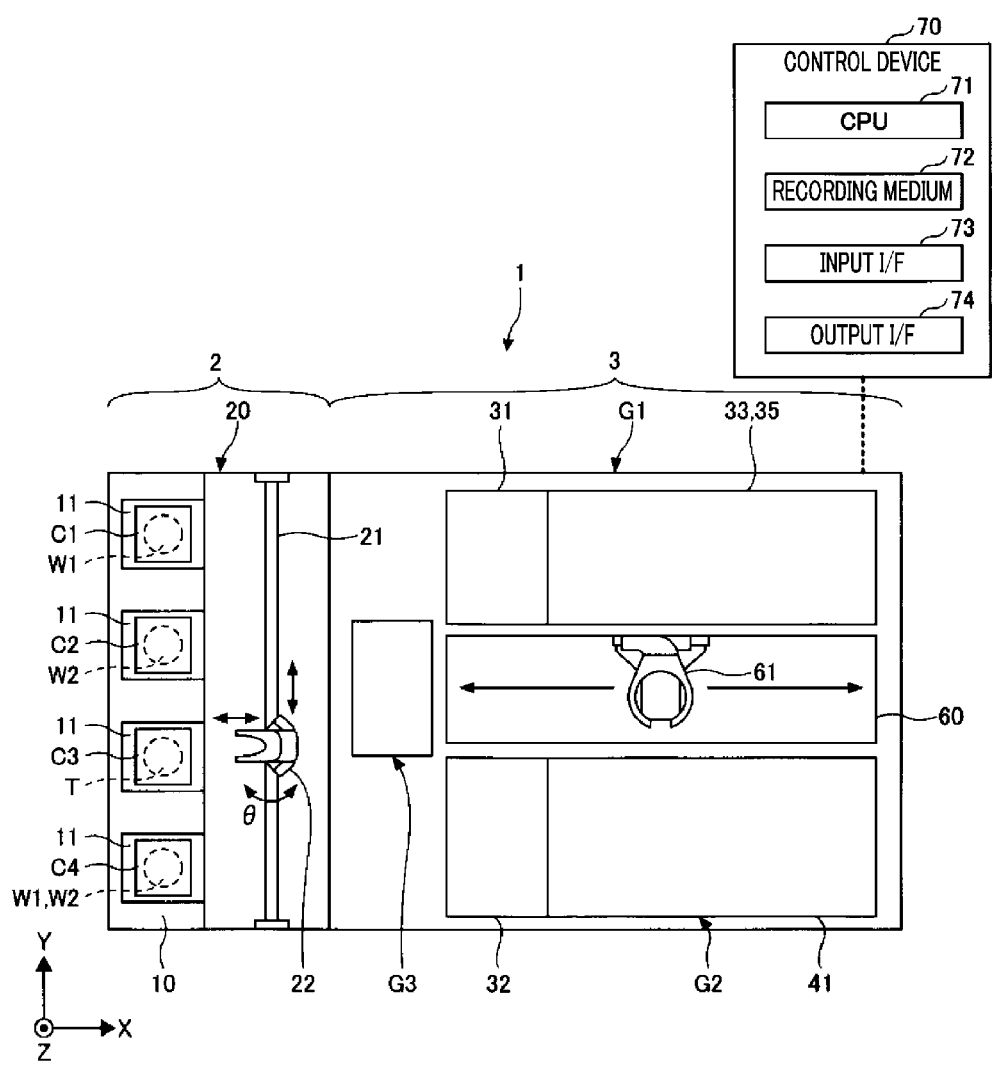
FIG. 1 is a plan view illustrating a bonding system according to an exemplary embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current exemplary embodiment. Still, the exemplary embodiments described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

Hereinafter, exemplary embodiments will be described with reference to the accompanying drawings. In the various drawings, same or corresponding parts will be assigned same reference numerals, and redundant description may be omitted. In the present specification, the X-axis direction, the Y-axis direction and the Z-axis direction are orthogonal to each other. The X-axis and Y-axis directions are horizontal directions whereas the Z-axis direction is a vertical direction.

Figure 2:
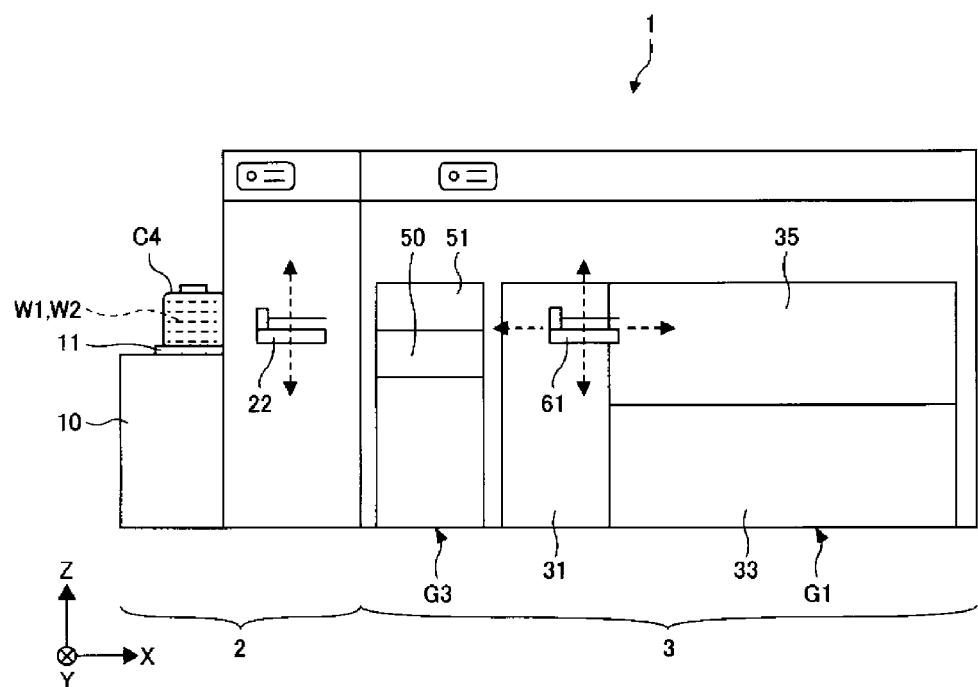
FIG. 2 is a front view illustrating the bonding system according to the exemplary embodiment.
Figure 3:
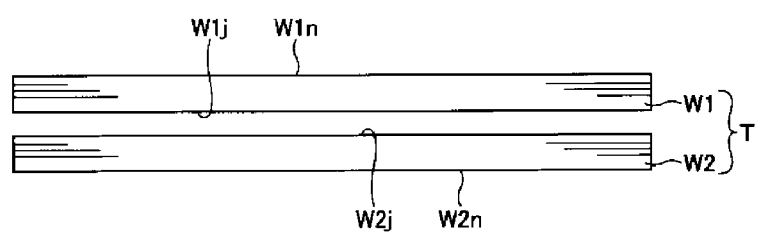
FIG. 3 is a side view illustrating a combined substrate separated into a first substrate and a second substrate.

FIG. 1 is a plan view illustrating a bonding system according to an exemplary embodiment. FIG. 2 is a front view illustrating the bonding system according to the exemplary embodiment. In FIG. 2, to illustrate a positional relationship between a cleaning apparatus 31, a surface modifying apparatus 33 and a surface hydrophilizing apparatus 35, illustration of an inspection apparatus 32 and a bonding apparatus 41 shown in FIG. 1 is omitted. FIG. 3 is a side view illustrating a combined substrate separated into a first substrate and a second substrate according to the exemplary embodiment.

The bonding system 1 shown in FIG. 1 forms a combined substrate T by bonding a first substrate W1 and a second substrate W2. The first substrate W1 is, for example, a semiconductor substrate such as a silicon wafer or a compound semiconductor wafer on which multiple electronic circuits are formed. The second substrate W2 is, for example, a substrate on which multiple electronic circuits are formed, like the first substrate W1, or a bare wafer on which no electronic circuit is formed. The first substrate W1 and the second substrate W2 have a substantially same diameter.

In the following, the first substrate W1 may sometimes be referred to as "upper wafer W1"; the second substrate W2, "lower wafer W2"; and the combined substrate T, "combined wafer T." Further, in the following description, as depicted in FIG. 3, among plate surfaces of the upper wafer W1, a surface to be bonded to the lower wafer W2 will be referred to as "bonding surface W1j", and a surface opposite to the bonding surface W1j will be referred to as "non-bonding surface W1n". Further, among plate surfaces of the lower wafer W2, a surface to be bonded to the upper wafer W1 will be referred to as "bonding surface W2j", and a surface opposite to the bonding surface W2j will be referred to as "non-bonding surface W2n."

Figure 4A:
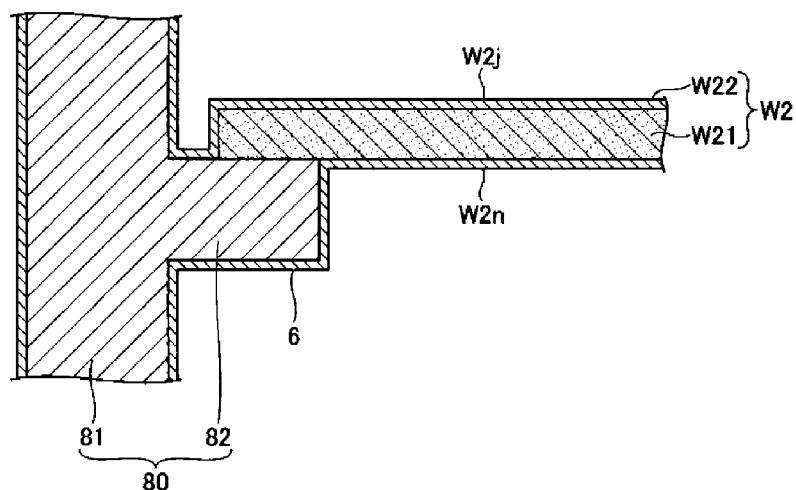
FIG. 4A and FIG. 4B are diagrams illustrating a manufacturing sequence of the second substrate according to the exemplary embodiment.
Figure 4B:
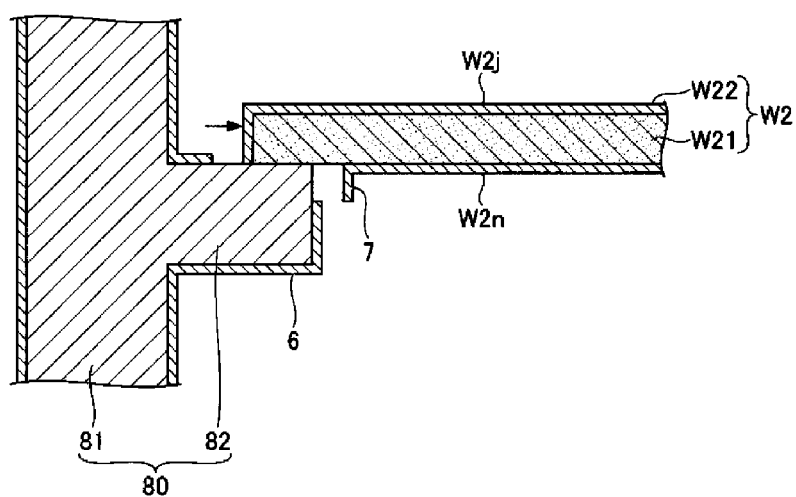

FIG. 4A and FIG. 4B are diagrams illustrating a manufacturing process of the second substrate according to the exemplary embodiment. FIG. 4A is a diagram illustrating the second substrate when film formation is performed according to the exemplary embodiment. FIG. 4B is a diagram illustrating the second substrate when cooling is performed according to the exemplary embodiment. Further, since a manufacturing process of the upper wafer W1 is the same as the manufacturing process of the lower wafer W2 shown in FIG. 4A and FIG. 4B, illustration of the manufacturing process of the upper wafer W1 is omitted.

The lower wafer W2 has a base substrate W21 and a film W22 formed on the base substrate W21. The film W22 is formed by, for example, a CVD method. In the CVD method, by supplying a source gas onto a surface of the base substrate W21, the film W22 is formed on the surface of the base substrate W21. At this time, a substrate holding device 80 holds the base substrate W21 horizontally so that the bonding surface W2j of the lower wafer W2 faces upwards.

The substrate holding device 80 holds a plurality of base substrates W21 at a regular interval in the vertical direction. The substrate holding device 80 has, for example, multiple lines of (for example, four) column members 81 extending in the vertical direction; and multiple supporting members 82 arranged at each of the multiple lines of column members 81 at a regular interval in the vertical direction. Each supporting members 82 supports a peripheral portion of the base substrate W21 from below.

The formation of the film W22 is performed at a high temperature. At this time, a deposit 6 which is the same material as the film W22 is deposited on the supporting members 82. Then, when the substrate holding device 80 and the lower wafer W2 are cooled, the lower wafer W2 is contracted relative to the substrate holding device 80. It is because a thermal expansion coefficient of the silicon, which is the material of the lower wafer W2, is larger than a thermal expansion coefficient of the quartz which is the material of the substrate holding device 80.

Since the lower wafer W2 is contracted relative to the substrate holding device 80, the deposit 6 is detached from the supporting members 82 and attaches to the non-bonding surface W2n of the lower wafer W2 as a deposit 7, as illustrated in FIG. 4B. The deposit 7 is formed at a portion of the non-bonding surface W2n supported by the supporting members 82. Specifically, the deposit 7 is formed at multiple places on a peripheral portion of the non-bonding surface W2n at an interval therebetween.

Figure 5:
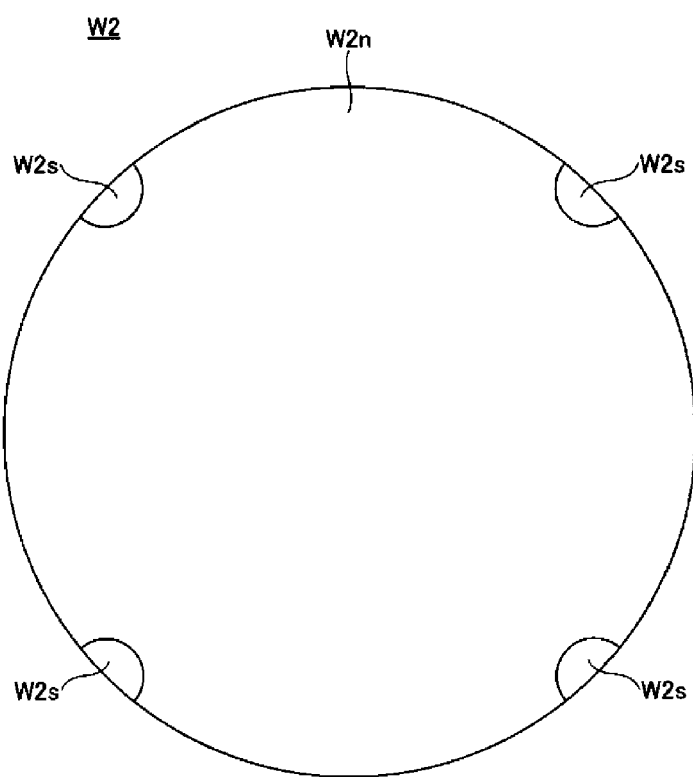
FIG. 5 is a diagram illustrating portions of the second substrate supported by supporting members according to the exemplary embodiment.

FIG. 5 is a diagram illustrating portions of the second substrate supported by the supporting members according to the exemplary embodiment. Since portions W2s of the lower wafer W2 supported by the supporting members 82 illustrated in FIG. 5 are at the same positions as portions of the upper wafer W1 supported by the supporting members 82, illustration of the portions of the upper wafer W1 supported by the supporting members 82 is omitted here.

The deposit 7 may attach to the four portions W2s corresponding to the four column members 81. Further, the number of the column members 81 is not limited to four. By way of example, the number of the column members 81 may be three, and, in such a case, the deposit may attach to three portions W2s. Furthermore, the substrate holding device 80 may hold the base substrate W21 vertically instead of holding it horizontally.

Figure 6:
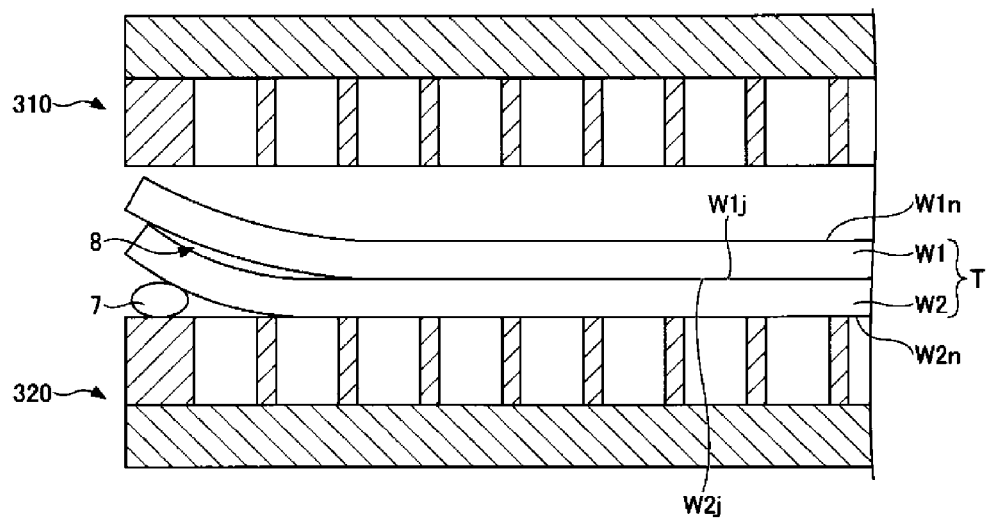
FIG. 6 is a diagram illustrating a void formed between the first substrate and the second substrate when the first substrate and the second substrate are bonded in a conventional way.

FIG. 6 is a diagram showing a void formed between the first substrate and the second substrate when the first substrate and the second substrate are bonded in a conventional way. As will be described in detail later, the bonding of the upper wafer W1 and the lower wafer W2 is gradually performed from central portions toward peripheral portions thereof (see FIG. 11 and FIG. 12A and FIG. 12B). At that time, the lower wafer W2 is maintained flat on a lower chuck 320, and the upper wafer W1 is separated from an upper chuck 310 gradually, starting from the central portion toward the peripheral portion thereof.

Conventionally, as depicted in FIG. 6, the deposit 7 may be introduced into a gap between a peripheral portion of the lower wafer W2 and the lower chuck 320. Since the deposit 7 locally deforms the lower wafer W2 upwards, a distance between the lower wafer W2 and the upper wafer W1 is locally reduced. As a result, an order of the bonding gets wrong, so that a void 8 is formed, as illustrated in FIG. 6.

Further, when bonding the upper and lower wafers W1 and W2, it may be considered to hold the upper wafer W1, instead of the lower wafer W2, horizontally by the upper chuck 310. In such a case, if the deposit 7 is introduced into a gap between a peripheral portion of the upper wafer W1 and the upper chuck 310, the void 8 is formed. The void 8 is formed because the wafer, which is supposed to be maintained flat when the bonding is performed, is deformed (distorted) by the deposit 7.

The bonding system 1 according to the present exemplary embodiment is equipped with the cleaning apparatus 31 configured to clean, before the bonding is performed, the non-bonding surface (for example, the non-bonding surface W2n) of the wafer (for example, the lower wafer W2) which is maintained flat and not deformed (distorted) when the bonding is performed. Since the deposit 7, which causes the void 8 when the bonding is performed, can be removed before the bonding is performed, the void 8 can be suppressed from being formed when the bonding is performed.

If the deposit 7 is carried into the bonding apparatus 41, the deposit 7 can e moved within the bonding apparatus 41. By way of example, if the deposit 7 is carried into the bonding apparatus 41 along with the upper wafer W1, the deposit 7 may adhere to the upper chuck 310. Then, the deposit 7 may fall down onto the lower chuck 320 from the upper chuck 310 to attach to the lower chuck 320.

Thus, before the bonding, the cleaning apparatus 31 may clean the non-bonding surface (for example, the non-bonding surface W1n) of the wafer (for example, the upper wafer W1) which is to be deformed (distorted) when the bonding is performed. Since the deposit 7 can be suppressed from being carried into the bonding apparatus 41, the formation of the void 8 can be further suppressed. Hereinafter, details of the bonding system 1 according to the present exemplary embodiment will be explained.

As depicted in FIG. 1, the bonding system 1 includes a carry-in/out station 2 and a processing station 3. The carry-in/out station 2 and the processing station 3 are arranged in this sequence along the positive X-axis direction. Further, the carry-in/out station 2 and the processing station 3 are connected as a single body.

The carry-in/out station 2 includes a placing table 10 and a transfer section 20. The placing table 10 is equipped with a multiple number of placing plates 11. Provided on the placing plates 11 are cassettes C1, C2, C3 and C4 each of which accommodates therein a plurality of (e.g., 25 sheets of) substrates horizontally. By way of example, the cassette C1 accommodates therein upper wafers W1; the cassette C2, lower wafers W2; and the cassette C3, combined wafers T; and the cassette C4, wafers among the upper wafers W1 and the lower wafers W2 from which the deposit 7 cannot be removed in the cleaning apparatus 31.

The transfer section 20 is provided adjacent to the positive X-axis side of the placing table 10. Provided in the transfer section 20 are a transfer path 21 extending in the Y-axis direction and a transfer device 22 configured to be movable along the transfer path 21. The transfer device 22 is configured to be movable in the X-axis direction as well as in the Y-axis direction and pivotable around the Z-axis. Further, the transfer device 22 is also configured to transfer the upper wafers W1, the lower wafers W2 and the combined wafers T between the cassettes C1 to C4 placed on the placing plates 11 and a third processing block G3 of the processing station 3 to be described later.

Further, the number of the cassettes C1 to C4 placed on the placing plates 11 is not limited to the shown example.

A multiple number of, for example, three processing blocks G1, G2 and G3 equipped with various kinds of devices are provided in the processing station 3. For example, the first processing block G1 is provided at a rear side (positive Y-axis side of FIG. 1) of the processing station 3, and the second processing block G2 is provided at a front side (negative Y-axis side of FIG. 1) of the processing station 3. Further, the third processing block G3 is provided at a side (negative X-axis side of FIG. 1) of the processing station 3 near the carry-in/out station 2.

Further, as illustrated in FIG. 1, a transfer section 60 is formed in a region surrounded by the first processing block G1, the second processing block G2 and the third processing block G3. A transfer device 61 is provided in the transfer section 60. The transfer device 61 is equipped with, for example, a transfer arm which is configured to be movable in a vertical direction and a horizontal direction and pivotable around a vertical axis. The transfer device 61 is moved within the transfer section 60 and transfers the upper wafers W1, the lower wafers W2 and the combined wafers T to/from required devices within the first processing block G1, the second processing block G2 and the third processing block G3 which are adjacent to the transfer section 60.

Provided in the first processing block G1 are a cleaning apparatus 31, a surface modifying apparatus 33, and a surface hydrophilizing apparatus 35. For example, the cleaning apparatus 31 is provided at a negative X-axis side of the surface modifying apparatus 33 and the surface hydrophilizing apparatus 35, as illustrated in FIG. 1. For example, the surface hydrophilizing apparatus 35 is disposed on the surface modifying apparatus 33, as shown in FIG. 2. Further, the kinds and the layout of the apparatuses disposed in the first processing block G1 are not particularly limited. By way of example, the cleaning apparatus 31 may be not be provided in the first processing block G1 but be provided in the second processing block G2 or the third processing block G3. By way of another example, the surface hydrophilizing apparatus 35 may be disposed under the surface modifying apparatus 33.

Figure 7:
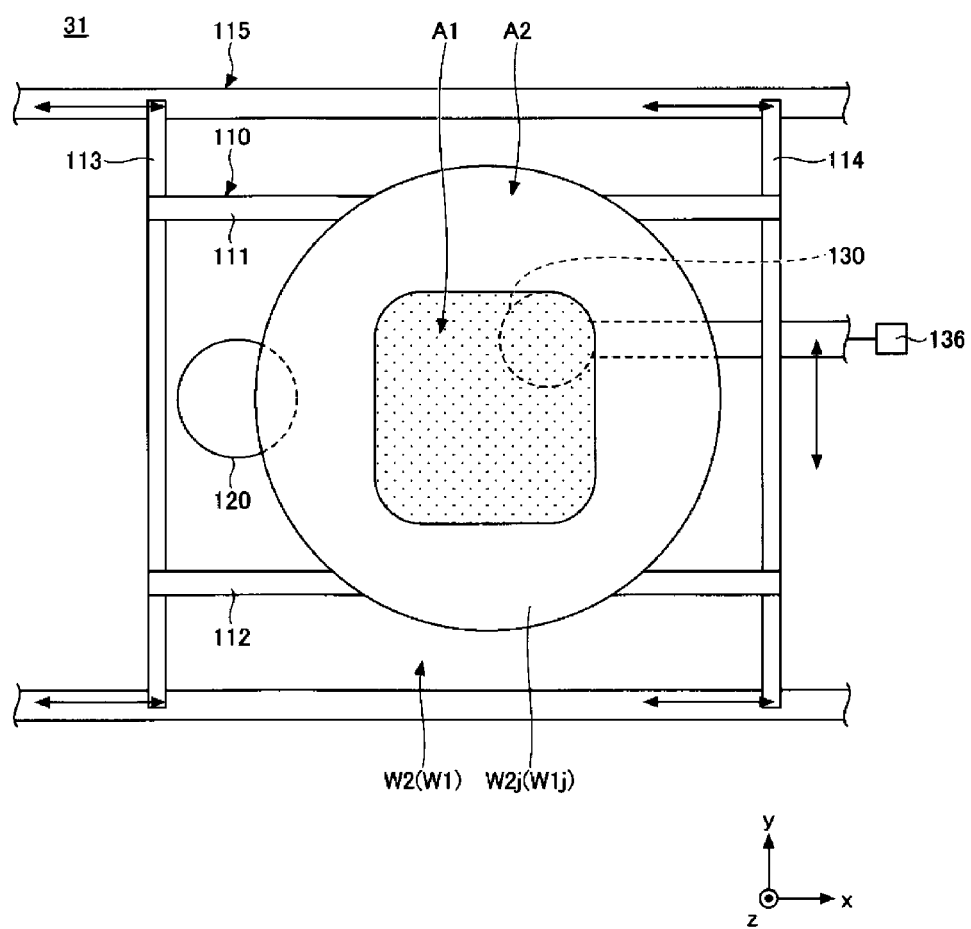
FIG. 7 is a plan view illustrating a cleaning apparatus according to the exemplary embodiment.
Figure 8A:
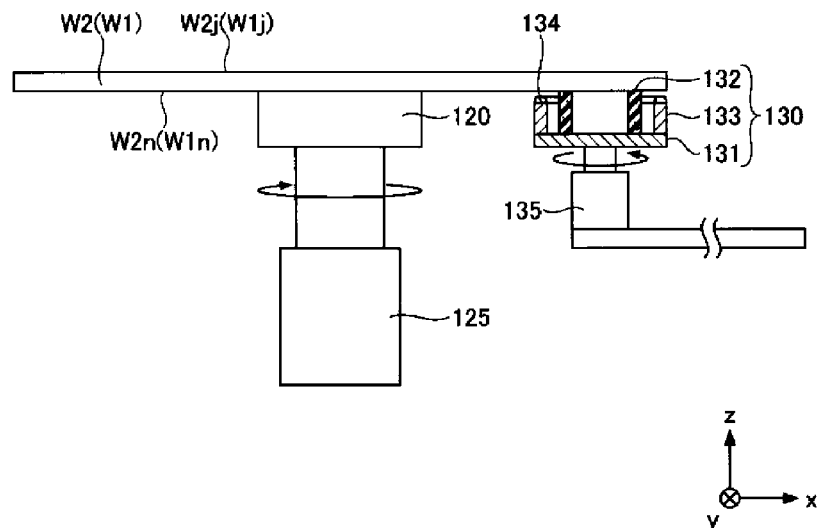
FIG. 8A and FIG. 8B are front views illustrating a second holder and a cleaning head according to the exemplary embodiment.
Figure 8B:
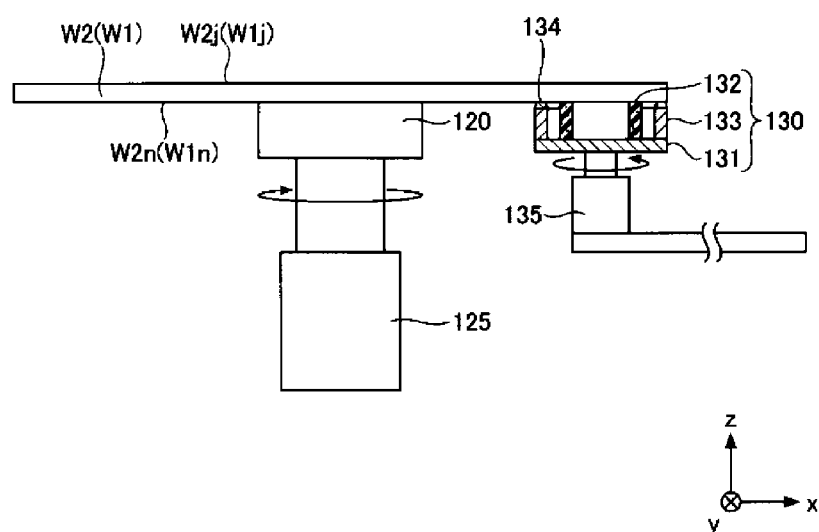
Figure 9:
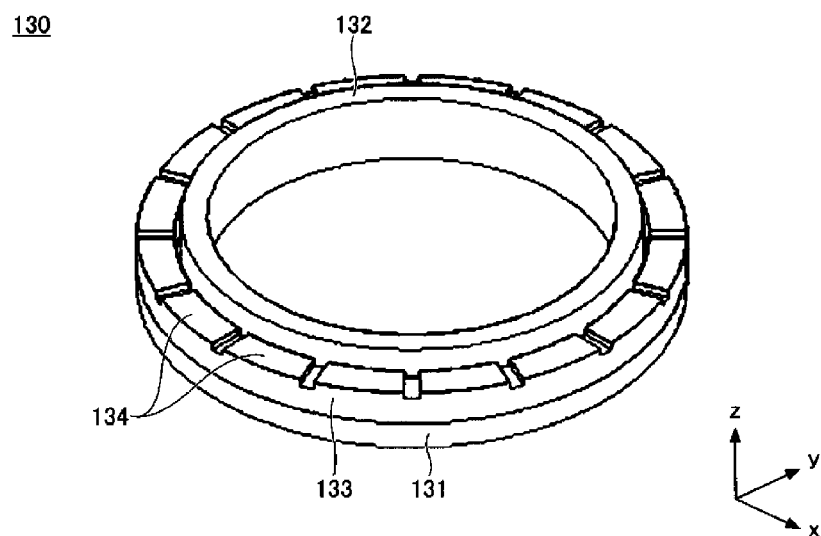
FIG. 9 is a perspective view illustrating the cleaning head according to the exemplary embodiment.

FIG. 7 is a plan view illustrating the cleaning apparatus according to the exemplary embodiment. FIG. 8A and FIG. 8B are front views illustrating a second holder and a cleaning head according to the exemplary embodiment. FIG. 8A is a front view illustrating a state in which a polishing member according to the exemplary embodiment and the second substrate are separated. FIG. 8B is a front view illustrating a state in which the polishing member according to the exemplary embodiment and the second substrate are in contact with each other. In FIG. 8A and FIG. 8B, illustration of the first holder shown in FIG. 7 is omitted. FIG. 9 is a perspective view illustrating the cleaning head according to the exemplary embodiment. In FIG. 7 to FIG. 9, the x-axis direction, the y-axis direction and the z-axis direction are orthogonal to each other. The x-axis and y-axis directions are horizontal directions whereas the Z-axis direction is a vertical direction. The z-axis direction coincides with the Z-axis direction. Either one (for example, the x-axis direction) of the x-axis and y-axis directions coincides with the X-axis direction, and the other (for example, the y-axis direction) coincides with the Y-axis direction.

The cleaning apparatus 31 cleans the non-bonding surface W2n of the lower wafer W2 before the lower wafer W2 is bonded in the bonding apparatus 41. Likewise, the cleaning apparatus 31 cleans the non-bonding surface W1n of the upper wafer W1 before the upper wafer W1 is bonded in the bonding apparatus 41. Below, the cleaning of the non-bonding surface W2n of the lower wafer W2 will be explained representatively, and description upon the cleaning of the non-bonding surface W1n of the upper wafer W1 will be omitted.

The cleaning apparatus 31 is equipped with, as illustrated in FIG. 7 or FIG. 8A and FIG. 8B, a first holder 110, a first driver 115, a second holder 120, a second driver 125, a cleaning head 130, a third driver 135 and a fourth driver 136.

The first holder 110 is configured to hold the lower wafer W2 horizontally from below such that the bonding surface W2j of the lower wafer W2 faces upwards. The first holder 110 holds a peripheral portion of the non-bonding surface W2n of the lower wafer W2. Since a central portion of the non-bonding surface W2n of the lower wafer W2 is not supported by the first holder 110, the central portion of the non-bonding surface W2n can be rubbed by the cleaning head 130 to be cleaned.

The first holder 110 is formed to have, for example, a hash shape. The first holder 110 has a pair of rod-shaped attracting members 111 and 112 and a pair of rod-shaped connecting members 113 and 114. The attracting members 111 and 112 extend in the x-axis direction. The attracting members 111 and 112 are connected with a vacuum pump via a pipeline. If a control device 70 operates the vacuum pump, the attracting members 111 and 112 attract the lower wafer W2 from below. The connecting members 113 and 114 extend in the y-axis direction, and connect the pair of attracting portions 111 and 112 with a distance therebetween in the y-axis direction.

The first driver 115 is configured to move the first holder 110. For example, the first driver 115 moves the first holder 110 in the x-axis direction. Further, the first driver 115 moves, for example, the first holder 110 in the z-axis direction.

The second holder 120 takes turns with the first holder 110, and holds the lower wafer W2 horizontally from below such that the bonding surface W2j of the lower wafer W2 faces upwards. Unlike the first holder 110, the second holder 120 holds the central portion of the non-bonding surface W2n of the lower wafer W2. Since the peripheral portion of the non-bonding surface W2n of the lower wafer W2 is not held by the second holder 120, this peripheral portion of the non-bonding surface W2n can be rubbed by the cleaning head 130 to be cleaned.

The second holder 120 is formed to have, for example, a disk shape. The second holder 120 is connected with a vacuum pump via a pipeline. If the control device 70 operates the vacuum pump, the second holder 120 attracts the lower wafer W2 from below.

The second driver 125 is configured to rotate the second holder 120 around the z-axis. Further, the second driver 125 moves the second holder 120 in the z-axis direction.

The cleaning head 130 is configured to clean the non-bonding surface W2n of the lower wafer W2 by rubbing it. The cleaning head 130 supplies a cleaning liquid such as water toward the non-bonding surface W2n of the lower wafer W2 while it is in contact with the non-bonding surface W2n of the lower wafer W2.

The cleaning head 130 is equipped with, for example, a base 131 having a disk shape, a cylindrical sponge 132 and a cylindrical polishing member 133. The sponge 132 is made of, for example, polyvinyl alcohol (PVA). The sponge 132 is fixed to the base 131, and rotated along with the base 131 to rub the non-bonding surface W2n of the lower wafer W2 to clean it, as illustrated in FIG. 8A and FIG. 8B.

The sponge 132 is fitted between the base 131 and the lower wafer W2 held by the second holder 120 in the vertical direction. As illustrated in FIG. 8B, if the sponge 132 is compressed in the vertical direction as the second holder 120 is lowered or the base 131 is raised, the polishing member 133 comes into contact with the non-bonding surface W2n of the lower wafer W2.

The polishing member 133 is disposed to be concentric with the sponge 132, surrounding the sponge 132, for example. The polishing member 133 is fixed to the base 131, and rotated along with the base 131 to polish the non-bonding surface W2n of the lower wafer W2. Accordingly, the deposit 7 strongly adhering to the non-bonding surface W2n can be peeled off, so that the non-bonding surface W2n can be flattened. Further, the polishing member 133 may also serve as a roughening member configured to roughen the non-bonding surface W2n. The roughening member roughens the non-bonding surface W2n by cutting an originally flat portion of the non-bonding surface W2n. Further, the polishing member 133 and the roughening member may be provided as separate members, and either one of them may be provided.

The polishing member 133 includes abrasive sheets 134 containing, for example, diamond abrasive particles. The abrasive sheets 134 are arranged at a regular interval therebetween in a circumferential direction. Since the diamond abrasive particles are hard, they can efficiently peel the deposit 7 which adheres to the non-bonding surface W2n of the lower wafer W2. Furthermore, silicon carbide abrasive particles, alumina abrasive particles, boron nitride abrasive particles of an isometric crystal may be used instead of the diamond abrasive particles. The abrasive sheets 134 may also serve as roughening sheets which roughen the non-bonding surface W2n. Further, the abrasive sheet 134 and the roughening sheet may be separate members, and either one of them may be provided.

The third driver 135 is configured to rotate the cleaning head 130 around the z-axis. Further, the fourth driver 136 is configured to move the cleaning head 130 in the y-axis direction.

Now, an operation of the cleaning apparatus 31 will be described. The cleaning apparatus 31 is operated as follows under the control of the control device 70.

First, while holding the peripheral portion of the lower wafer W2 with the first holder 110, the cleaning apparatus 31 rubs the central portion of the lower wafer W2 with the cleaning head 130 to clean it. The cleaning apparatus 31 may rub and clean the central portion of the lower wafer W2 with only the sponge 132 or with both the sponge 132 and the polishing member 133, while rotating the base 131. By alternately repeating a movement of the first holder 110 in the x-axis direction and a movement of the cleaning head 130 in the y-axis direction, the cleaning apparatus 31 cleans a first region A1 (region indicated by dots in FIG. 7) of the non-bonding surface W2n of the lower wafer W2. The first region A1 has a rectangular shape.

Subsequently, while holding the central portion of the lower wafer W2 with the second holder 120, the cleaning apparatus 31 rubs the peripheral portion of the lower wafer W2 with the cleaning head 130 to clean it. The cleaning apparatus 31 may rub and clean the peripheral portion of the lower wafer W2 with only the sponge 132 or with both the sponge 132 and the polishing member 133, while rotating the base 131. The cleaning apparatus 31 cleans a second region A2 of the non-bonding surface W2n of the lower wafer W2 by moving the cleaning head 130 in the y-axis direction while rotating the second holder 120 around the z-axis. The second region A2 is a region outside the first region A1 and surrounds the first region A1.

Further, the order of the cleaning may be reversed. To be specific, the cleaning apparatus 31 may first rub and clean the peripheral portion of the lower wafer W2 with the cleaning head 130 while holding the central portion of the lower wafer W2 with the second holder 120, and, then rub and clean the central portion of the lower wafer W2 with the cleaning head 130 while holding the peripheral portion of the lower wafer W2 with the first holder 110.

The lower wafer W2 cleaned in the cleaning apparatus 31 is transferred into the inspection apparatus 32 by the transfer device 61. The inspection apparatus 32 will be elaborated later. After being inspected in the inspection apparatus 32, the lower wafer W2 is transferred into the surface modifying apparatus 33 by the transfer device 61. Further, the inspection apparatus 32 may be omitted. In such a case, the lower wafer W2 cleaned in the cleaning apparatus 31 is transferred into the surface modifying apparatus 33 by the transfer device 61.

The surface modifying apparatus 33 is configured to modify the bonding surface W1j of the upper wafer W1 and the bonding surface W2j of the lower wafer W2. In the surface modifying apparatus 33, a $SiO_2$ bond on the bonding surfaces W1j and W2j is cut to be turned into SiO of a single bond, so that the bonding surfaces W1j and W2j are modified such that these surfaces are easily hydrophilized later.

In the surface modifying apparatus 33, an oxygen gas as a processing gas is excited into plasma under, for example, a decompressed atmosphere to be ionized. As these oxygen ions are irradiated to the bonding surface W1j of the upper wafer W1 and the bonding surface W2j of the lower wafer W2, the bonding surfaces W1j and W2j are plasma-processed to be modified. The processing gas is not limited to the oxygen gas, and may be a nitrogen gas or the like.

The surface hydrophilizing apparatus 35 is configured to hydrophilize the bonding surfaces W1j and W2j of the upper wafer W1 and the lower wafer W2 with, for example, pure water. This surface hydrophilizing apparatus 35 also has a function of cleaning the bonding surfaces W1j and W2j. In this surface hydrophilizing apparatus 35, while rotating the upper wafer W1 or the lower wafer W2 held by, for example, a spin chuck, the pure water is supplied onto the upper wafer W1 or the lower wafer W2. Accordingly, the pure water supplied onto the upper wafer W1 or the lower wafer W2 is diffused onto the bonding surface W1j of the upper wafer W1 or the bonding surface W2j of the lower wafer W2, so that the bonding surfaces W1j and W2j are hydrophilized.

Provided in the second processing block G2 are the inspection apparatus 32 and the bonding apparatus 41. The inspection apparatus 32 is disposed at, for example, a negative X-axis side of the bonding apparatus 41, as illustrated in FIG. 1. Further, the kinds and the layout of the apparatuses disposed in the second processing block G2 are not particularly limited. By way of example, the inspection apparatus 32 may be disposed in the first processing block Gi or the third processing block G3, not in the second processing block G2.

Figure 10:
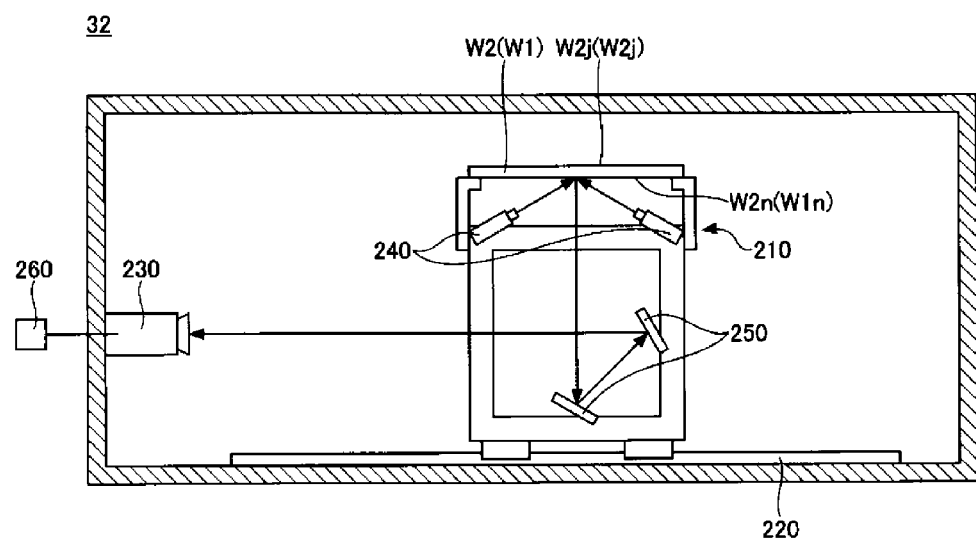
FIG. 10 is a diagram illustrating an inspection apparatus according to the exemplary embodiment.

FIG. 10 is a diagram illustrating the inspection apparatus according to the exemplary embodiment. The inspection apparatus 32 inspects presence or absence of the deposit 7 adhering to the non-bonding surface W2n of the lower wafer W2 before the lower wafer W2 is bonded in the bonding apparatus 41. Likewise, the inspection apparatus 32 inspects presence or absence of the deposit 7 adhering to the non-bonding surface W1n of the upper wafer W1 before the upper wafer W1 is bonded in the bonding apparatus 41. Below, the inspection upon the non-bonding surface W2n of the lower wafer W2 will be explained representatively, while omitting description of the inspection upon the non-bonding surface W1n of the upper wafer W1. The inspection apparatus 32 is equipped with a holder 210, a guide 220, an imager 230, a lighting unit 240, a mirror unit 250, and an image processor 260.

The holder 210 holds the lower wafer W2 horizontally from below such that the bonding surface W2j of the lower wafer W2 faces upwards. The holder 210 is configured to be moved in the horizontal direction along the guide 220. The imager 230 images the non-bonding surface W2n of the lower wafer W2. A range of the imaging is a straight line-shaped region orthogonal to a moving direction of the holder 210. The imager 230 includes an imaging device such as, but not limited to, CCD or CMOS. The lighting unit 240 irradiates light to the non-bonding surface W2n of the lower wafer W2. A range of the irradiation of the light includes the range of the imaging at least. The mirror unit 250 is configured to reflect the light reflected from the non-bonding surface W2n toward the imager 230.

As the holder 210 is moved along the guide 220, the imager 230 is capable of imaging the entire non-bonding surface W2n. The imager 230 sends obtained images to the image processor 260. The image process 260 is composed of a computer or the like, and determines presence or absence of the deposit 7 adhering to the non-bonding surface W2n by image-processing the images obtained by the imager 230. Further, though the image processor 260 is provided as a separate device from the control device 70 in the present exemplary embodiment, the image processor 260 may be provided as a part of the control device 70.

Since the inspection apparatus 32 inspects the presence or absence of the deposit 7 adhering to the non-bonding surface W2n of the lower wafer W2 before the bonding of the lower wafer W2 is performed, as stated above, the deposit 7 can be suppressed from being carried into the bonding apparatus 41. The lower wafer W2 having the deposit 7 attached thereto is cleaned by the cleaning apparatus 31, and then, inspected again in the inspection apparatus 32. Alternatively, the lower wafer W2 having the deposit 7 attached thereto is collected into the cassette C4. Meanwhile, the lower wafer W2 without the deposit 7 attached thereto is transferred into the surface modifying apparatus 33 by the transfer device 61.

Further, the inspection apparatus 32 may not inspect the entire non-bonding surface W2n of the lower wafer W2. The inspection apparatus 32 needs to inspect at least the peripheral portion of the non-bonding surface W2n. It is because the deposit 7 easily adhere to the peripheral portion of the non-bonding surface W2n if it is originated from the deposit 6 which is the same material as the film W22.

Figure 11:
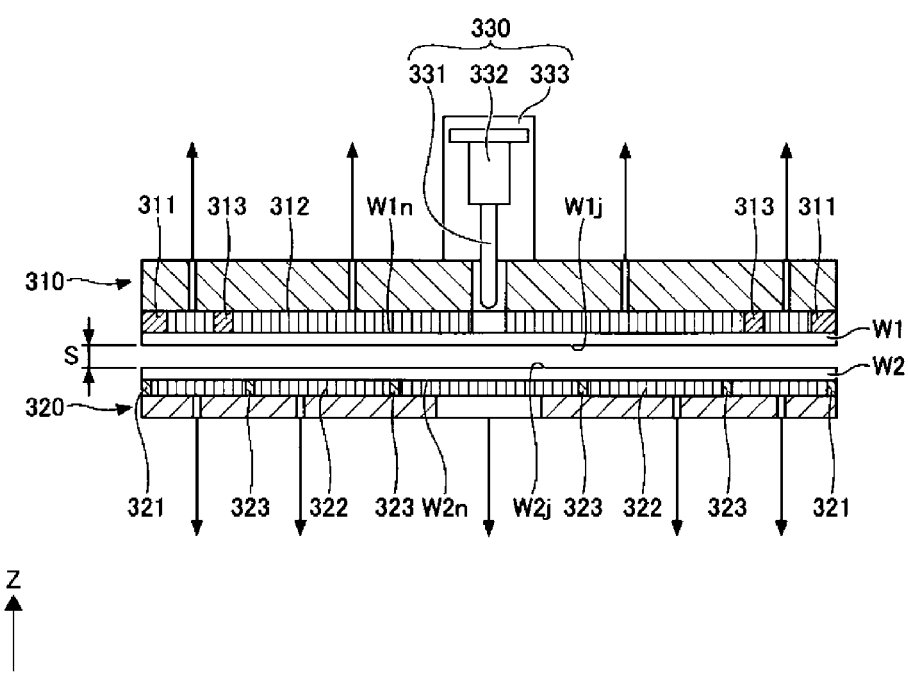
FIG. 11 is a diagram illustrating a bonding apparatus according to the exemplary embodiment.
Figure 12A:
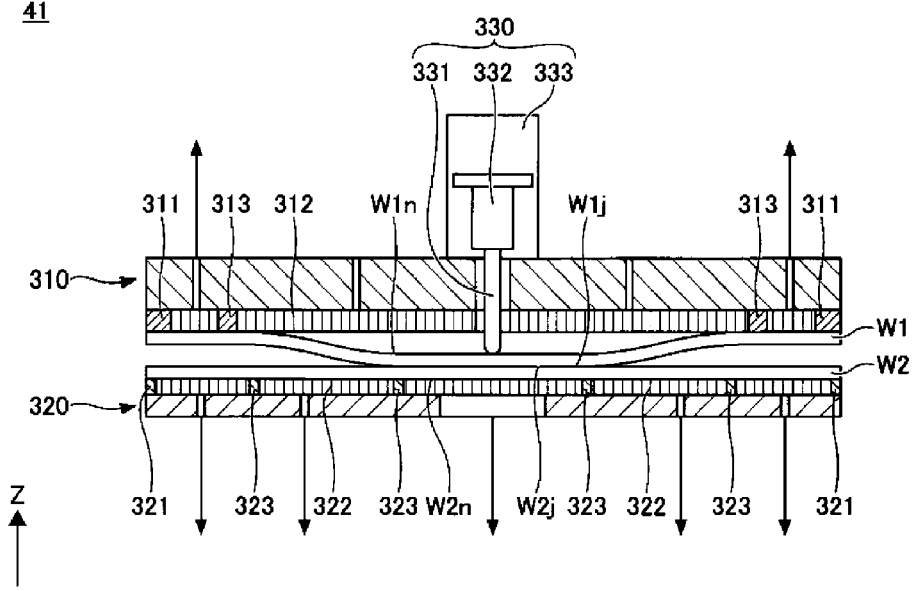
FIG. 12A and FIG. 12B are diagrams illustrating an operation of the bonding apparatus according to the exemplary embodiment.
Figure 12B:
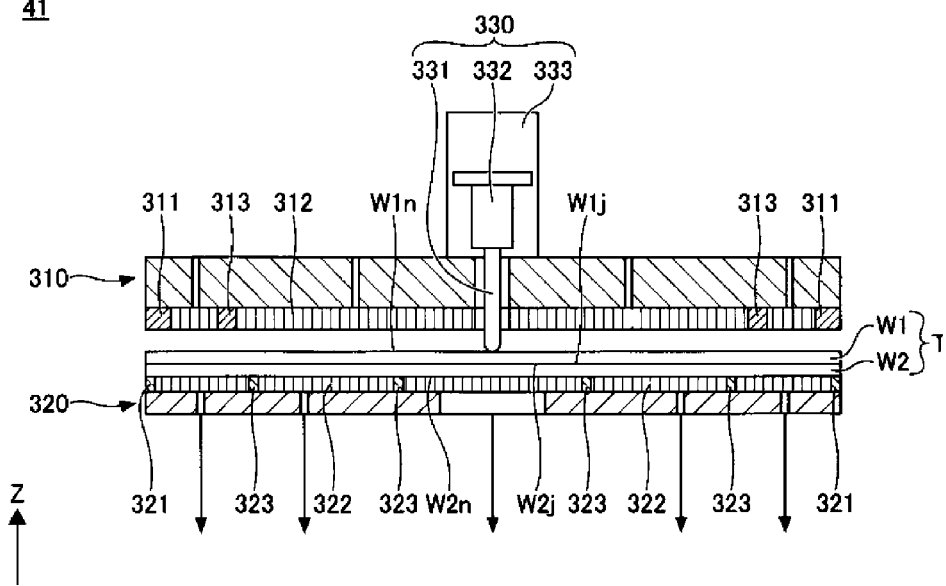

FIG. 11 is a diagram illustrating the bonding apparatus according to the exemplary embodiment. FIG. 12A and FIG. 12B are diagrams illustrating an operation of the bonding apparatus according to the exemplary embodiment. FIG. 12A is a diagram illustrating a state in which the upper chuck shown in FIG. 11 has released the attraction of the central portion of the upper wafer. FIG. 12B is a diagram showing a state in which the upper chuck shown in FIG. 12A has released the attraction of the peripheral portion of the upper wafer.

While arranging the hydrophilized bonding surface W1j of the upper wafer W1 and the hydrophilized bonding surface W2j of the lower wafer W2 to face each other, as shown in FIG. 11, the bonding apparatus 41 bonds the upper wafer W1 and the lower wafer W2, as shown in FIG. 12A and FIG. 12B. The bonding apparatus 41 includes, for example, the upper chuck 310, the lower chuck 320 and a pressing unit 330.

The upper chuck 310 holds the upper wafer W1 horizontally from above while allowing the bonding surface W1$j$ of the upper wafer W1 to face down. The upper chuck 310 corresponds to a first substrate holder as claimed in claims. The upper chuck 310 is, for example, a pin chuck, and includes a first frame member 311 and first pin members 312. The first frame member 311 has a circular ring shape and supports a peripheral portion of the non-bonding surface W1$n$ of the upper wafer W1. The first pin members 312 are distributed at an inside of the first frame member 311 and supports the non-bonding surface W1$n$ of the upper wafer W1.

The upper chuck 310 is connected to a vacuum pump via a pipeline. If the control device 70 operates the vacuum pump, the upper chuck 310 attracts the upper wafer W1. The upper chuck 310 has a first partition member 313 configured to partition the upper chuck 310 into multiple regions to control an attracting pressure for the upper wafer W1 independently in the multiple regions. Inside the first frame member 311, the first partition member 313 is formed to be concentric with the first frame member 311. A vacuum degree can be controlled independently at an inside and an outside the first partition member 313, so that the attraction and the release of the attraction can be controlled independently.

The lower chuck 320 holds the lower wafer W2 horizontally from below while allowing the bonding surface W2$j$ of the lower wafer W2 to face up. The lower chuck 320 corresponds to a second substrate holder as claimed in claims. The lower chuck 320 is, for example, a pin chuck, and includes a second frame member 321 and second pin members 322. The second frame member 321 has a circular ring shape and supports a peripheral portion of the non-bonding surface W2$n$ of the lower wafer W2. The second pin members 322 are distributed at an inside of the second frame member 321 and supports the non-bonding surface W2$n$ of the lower wafer W2.

The lower chuck 320 is connected to a vacuum pump via a pipeline. If the control device 70 operates the vacuum pump, the lower chuck 320 attracts the lower wafer W2. The lower chuck 320 has a second partition member 323 configured to partition the lower chuck 320 into multiple regions to control an attracting pressure for the lower wafer W2 independently in the multiple regions. Inside the second frame member 321, the second partition member 323 is formed to be concentric with the second frame member 321. A vacuum degree can be controlled independently at an inside and an outside the second frame member 323, so that the attraction and the release of the attraction can be controlled independently. Thus, the deformation of the lower wafer W2 can be controlled.

The pressing unit 330 is configured to press the central portion of the upper wafer W1 from above. The pressing unit 330 includes a pressing pin 331, an actuator 332, and an elevating mechanism 333. The pressing pin 331 is placed in a through hole formed through the central portion of the upper chuck 310 in the vertical direction. The actuator 332 presses the pressing pin 331 down with a constant force by air supplied from, for example, an electropneumatic regulator. The elevating mechanism 333 is fixed to the upper chuck 310 and moves the actuator 332 up and down.

Now, the operation of the bonding apparatus 41 will be explained. The bonding apparatus 41 performs the following operations under the control of the control device 70.

First, the bonding apparatus 41 attracts the entire region of the upper wafer W1 in the diametrical direction with the upper chuck 310, and attracts the entire region of the lower wafer W2 in the diametrical direction with the lower chuck 320, as illustrate in FIG. 11. The bonding apparatus 41 is equipped with non-illustrated lift pins configured to support the central portion of the lower wafer W2 and a driver configured to move the lift pins up and down. The lift pin is protruded above the lower chuck 320 to receive the lower wafer W2 and then is lowered to deliver the lower wafer W2 onto the lower chuck 320. Since the lift pins do not support the peripheral portion of the lower wafer W2, the lower wafer W2 is placed on the lower chuck 320 while being bent in an upwardly protruding state. If the non-bonding surface W2$n$ of the lower wafer W2 is roughened in the cleaning apparatus 31 in advance, a contact area between the lower wafer W2 and the lower chuck 320 can be reduced, so that friction resistance between the lower wafer W2 and the lower chuck 320 can be reduced. Therefore, when the lower wafer W2 is attracted to the lower chuck 320, the lower wafer W2 is delivered onto the lower chuck 320 smoothly. A distance S between the bonding surface W2$j$ of the lower wafer W2 and the bonding surface W1$j$ of the upper wafer W1 is adjusted to a required distance, for example, 50 μm to 200 μm. Here, "the roughening" implies that the non-bonding surface W2$n$ of the lower wafer W2 is given surface roughness allowing the lower wafer W2 not to be deviated from where it is supposed to be located during a period until the attraction of the lower wafer W2 by the lower chuck 320 is completed after the attraction is begun.

Thereafter, the bonding apparatus 41 releases the attraction of the central portion of the upper wafer W1 and presses the central portion of the upper wafer W1 from above with the pressing unit 330, as illustrated in FIG. 12A. Accordingly, the central portion of the upper wafer W1 comes into contact with the central portion of the lower wafer W2, so that bonding is begun. Then, a bonding wave is generated, whereby the upper wafer W1 and the lower wafer W2 are gradually bonded from the central portions toward the peripheral portions thereof. If the non-bonding surface W1$n$ of the upper wafer W1 is roughened in the cleaning apparatus 31 in advance, a contact area between the upper wafer W1 and the upper chuck 310 can be reduced, so that a force required to separate the upper wafer W1 and the upper chuck 310 can be reduced. Thus, the separation between the upper wafer W1 and the upper chuck 310 can be smoothly carried out from the central portion of the upper wafer W1 toward the peripheral portion thereof.

Here, since the bonding surface W1$j$ of the upper wafer W1 and the bonding-surface W2$j$ of the lower wafer W2 are modified, a Van der Waals force (intermolecular force) is first generated between the bonding surfaces W1$j$ and W2$j$, so that the bonding surfaces W1$j$ and W2$j$ are bonded. Furthermore, since the bonding surface W1$j$ of the upper wafer W1 and the bonding surface W2$j$ of the lower wafer W2 are hydrophilized, hydrophilic groups between the bonding surfaces W1$j$ and W2$j$ are hydrogen-bonded, so that the bonding surfaces W1$j$ and W2$j$ are firmly bonded.

Subsequently, the bonding apparatus 41 releases the attraction of the peripheral portion of the upper wafer W1 in the state that the central portion of the upper wafer W1 is pressed against the central portion of the lower wafer W2 with the pressing unit 330, as illustrated in FIG. 12B. If slipping of the peripheral portion of the upper wafer W1 can be suppressed until the attraction of the peripheral portion of the upper wafer W1 is released, position deviation between the upper wafer W1 and the lower wafer W2 can be suppressed. Thus, the cleaning apparatus 31 does not roughen the peripheral portion of the non-bonding surface W1$n$ of the upper wafer W1 to suppress the slipping of the peripheral portion of the upper wafer W1. Here, a non-roughened region includes at least a region within 10 mm from an edge of the non-boning surface W1n. The non-roughened region should not be rubbed by the roughening member to be cleaned, but it may be rubbed by the sponge 132. The cleaning apparatus 31 roughens the non-bonding surface W1n except the peripheral portion thereof. Since the peripheral portion of the non-bonding surface W1n is not roughened, adhesiveness between the peripheral portion of the upper wafer W1 and the upper chuck 310 can be improved. The improvement of the adhesiveness leads to an increase of the friction resistance and a reduction of vacuum leakage. As a result, the slipping of the peripheral portion of the upper wafer W1 can be suppressed, so that the position deviation between the upper wafer W1 and the lower wafer W2 can be reduced. If the attraction of the peripheral portion of the upper wafer W1 is released, the entire bonding surface W1j of the upper wafer W1 and the entire bonding surface W2j of the lower wafer W2 are in contact with each other, so that the upper wafer W1 and the lower wafer W2 are bonded. Then, the bonding apparatus 41 raises the pressing pin 331 up to the upper chuck 310, and the attraction of the lower wafer W2 is released.

In the third processing block G3, as shown in FIG. 2, transition devices 50 and 51 are provided. The transition device 50 stores therein the upper wafer W1 and the lower wafer W2 temporarily, and the transition device 51 stores therein the combined wafer T1 temporarily. The transition devices 50 and 51 are stacked in the vertical direction. Further, the kind and the layout of the devices disposed in the third processing block G3 are not particularly limited.

Further, as illustrated in FIG. 1, the bonding sysem 1 includes the control device 70. The control device 70 may be implemented by, for example, a computer and includes a CPU (Central Processing Unit) 71 and a recording medium 72 such as a memory. The recording medium 72 stores therein a program for controlling various processings performed in the bonding system 1. The control device 70 controls the operation of the bonding system 1 as the CPU 71 executes the program stored in the recording medium 72. Furthermore, the control device 70 is equipped with an input interface 73 and an output interface 74. The control device 70 receives a signal from an outside through the input interface 73 and transmits a signal to the outside through the output interface 74.

The program of the control device 70 may be recorded in, for example, a computer-readable recording medium and installed from the recording medium. The computer-readable recording medium may be, by way of non-limiting example, a hard disc (HD), a flexible disc (FD), a compact disc (CD), a magnet optical disc (MO), or a memory card. Further, the program of the control device 70 may be installed by being downloaded from a server through Internet.

Figure 13:
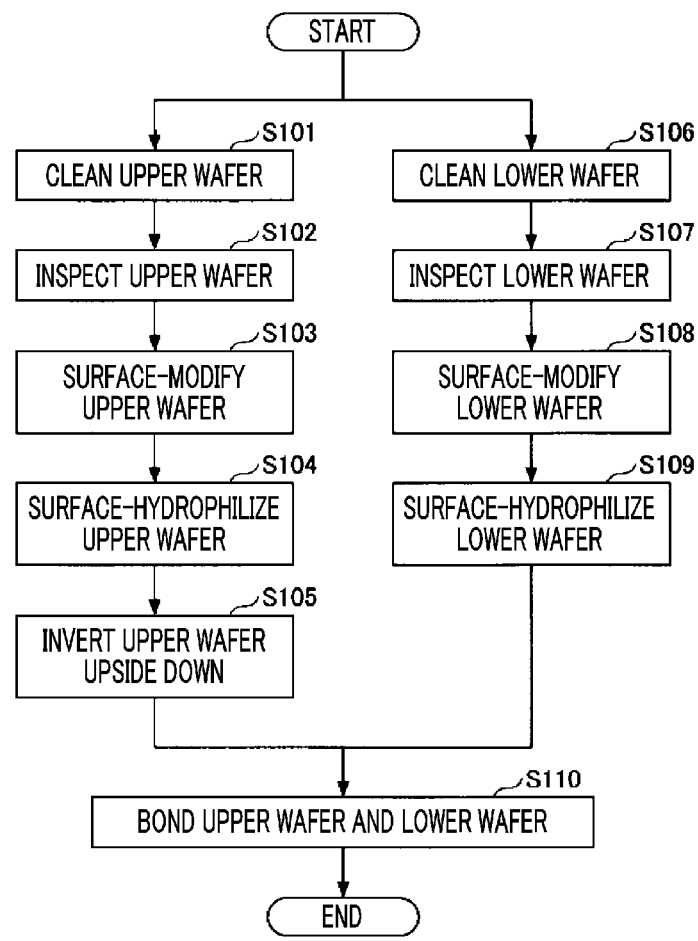
FIG. 13 is a flowchart illustrating major processes of a bonding method according to the exemplary embodiment.

FIG. 13 is a flowchart illustrating major processes of a bonding method according to the exemplary embodiment. The various processes described in FIG. 13 are performed under the control of the control device 70.

First, the cassette C1 accommodating the upper wafers W1, the cassette C2 accommodating the lower wafers W2 and the empty cassettes C3 and C4 are placed on the preset placing plates 11 of the carry-in/out station 2.

Then, the transfer device 22 takes out the upper wafer W1 from the cassette C1 and transfers the taken upper wafer W1 to the transition device 50. Then, the transfer device 61 receives the upper wafer W1 from the transition device 50 and transfers the received upper wafer W1 into the cleaning apparatus 31.

Thereafter, the cleaning apparatus 31 cleans the non-bonding surface W1n of the upper wafer W1 (S101). The cleaning apparatus 31 cleans at least the peripheral portion of the non-bonding surface W1n. It is because the deposit 7 easily adhere to the peripheral portion of the non-bonding surface W1n if it is originated from the deposit 6 which is the same material as the film W22. If the deposit 7 firmly adheres, the deposit 7 may be peeled off by the polishing member 133. Thereafter, the transfer device 61 receives the upper wafer W1 from the cleaning apparatus 31 and transfers the received upper wafer W1 into the inspection apparatus 32.

Then, the inspection apparatus 32 inspects presence or absence of the deposit 7 adhering to the non-bonding surface W1n of the upper wafer W1 (S102). The upper wafer W1 having the deposit 7 attached thereto is cleaned again in the cleaning apparatus 31 and is then inspected again by the inspection apparatus 32. Alternatively, the upper wafer W1 having the deposit 7 attached thereto is collected into the cassette C4. Meanwhile, the upper wafer W1 without having the deposit 7 is transferred by the transfer device 61 into the surface modifying apparatus 33.

Thereafter, the surface modifying apparatus 33 modifies the bonding surface W1j of the upper wafer W1 (S103). In the surface modifying apparatus 33, the oxygen gas as the processing gas is excited into plasma to be ionized under the decompressed atmosphere. The oxygen ions are irradiated to the bonding surface W1j of the upper wafer W1, and the bonding surface W1j is plasma-processed. As a result, the bonding surface W1j of the upper wafer W1 is modified. Then, the transfer device 61 transfers the upper wafer W1 from the surface modifying apparatus 33 into the surface hydrophilizing apparatus 35.

Then, the surface hydrophilizing apparatus 35 hydrophilizes the bonding surface W1j of the upper wafer W1 (S104). In the surface hydrophilizing apparatus 35, the pure water is supplied onto the upper wafer W1 while rotating the upper wafer W1 held by the spin chuck. The supplied pure water is diffused on the bonding surface W1j of the upper wafer W1, and hydroxyl groups (silanol groups) adhere to the bonding surface W1j of the upper wafer W1 modified in the surface modifying apparatus 33, so that the bonding surface W1j is hydrophilized. Further, the bonding surface W1j of the upper wafer W1 is cleaned by this pure water used to hydrophilize the bonding surface W1j. Thereafter, the transfer device 61 transfers the upper wafer W1 into the bonding apparatus 41.

The bonding apparatus 41 inverts the upper wafer W1 upside down, turning the bonding surface W1j of the upper wafer W1 to face down (S105). Though an inverting device configured to invert the upper wafer W1 upside down is provided within the bonding apparatus 41 in the present exemplary embodiment, the inverting device may be provided at an outside of the bonding apparatus 41. While the processing (S101 to S105) of the upper wafer W1 is being performed, a processing (processes S106 to S109 to be described below) of the lower wafer W2 is performed.

First, the transfer device 22 takes out the lower wafer W2 from the cassette C2 and transfers the taken lower wafer W2 into the transition device 50. Then, the transfer device 61 receives the lower wafer W2 from the transition device 50 and transfers the received lower wafer W2 into the cleaning apparatus 31.

Then, the cleaning apparatus 31 cleans the non-bonding surface W2n of the lower wafer W2 (S106). The cleaning apparatus 31 cleans at least the peripheral portion of the non-bonding surface W2n. It is because the deposit 7 easily adhere to the peripheral portion of the non-bonding surface W2n if it is originated from the deposit 6 which is the same material as the film W22. If the deposit 7 firmly adheres, the deposit 7 may be peeled off by the polishing member 133. Thereafter, the transfer device 61 receives the lower wafer W2 from the cleaning apparatus 31 and transfers the received lower wafer W2 into the inspection apparatus 32.

Then, the inspection apparatus 32 inspects presence or absence of the deposit 7 adhering to the non-bonding surface W2n of the lower wafer W2 (S107). The lower wafer W2 having the deposit 7 attached thereto is cleaned again in the cleaning apparatus 31 and is then inspected again by the inspection apparatus 32. Alternatively, the lower wafer W2 having the deposit 7 attached thereto is collected into the cassette C4. Meanwhile, the lower wafer W2 without having the deposit 7 is transferred by the transfer device 61 into the surface modifying apparatus 33.

Thereafter, the surface modifying apparatus 33 modifies the bonding surface W2j of the lower wafer W2 (S108). In the surface modifying apparatus 33, the surface modification (S108) of the bonding surface W2j is performed in the same way as the surface modification (S103) of the bonding surface W1j. Then, the transfer device 61 transfers the lower wafer W2 from the surface modifying apparatus 33 into the surface hydrophilizing apparatus 35.

Then, the surface hydrophilizing apparatus 35 hydrophilizes the bonding surface W2j of the lower wafer W2 (S109). The surface hydrophilization (S109) of the bonding surface W2j is performed in the same way as the surface hydrophilization (S104) of the bonding surface W1j. Thereafter, the transfer device 61 transfers the lower wafer W2 into the bonding apparatus 41.

Subsequently, the bonding apparatus 41 bonds the upper wafer W1 and the lower wafer W2 with the bonding surface W1j of the upper wafer W1 and the bonding surface W2j of the lower wafer W2 facing each other (S110). Since the bonding surface W1j of the upper wafer W1 and the bonding surface W2j of the lower wafer W2 are previously modified, a Van der Waals force (intermolecular force) is generated between the bonding surfaces W1j and W2j, so that the bonding surfaces W1j and W2j are bonded. Furthermore, since the bonding surface W1j of the upper wafer W1 and the bonding surface W2j of the lower wafer W2 are hydrophilized in advance, hydrophilic groups between the bonding surfaces W1j and W2j are hydrogen-bonded, so that the bonding surfaces W1j and W2j are firmly bonded.

Thereafter, the transfer device 61 transfers the combined wafer T into the transition device 51. Then, the transfer device 22 receives the combined wafer T from the transition device 51 and transfers the received combined wafer T into the cassette C3. Then, the series of processes are ended.

The control device 70 allows the upper wafer W1 and the lower wafer W2 to be transferred into the cleaning apparatus 31 and the inspection apparatus 32 in this sequence. Since the cleaning is first performed in the cleaning apparatus 31, the deposit 7 can be suppressed from being carried into the inspection apparatus 32.

Further, the control device 70 may transfer the upper wafer W1 and the lower wafer W2 into the inspection apparatus 32 and the cleaning apparatus 31 in this sequence. In such a case, since the inspection is first performed in the inspection apparatus 32, unnecessary cleaning of the wafer without having the deposit 7 in the cleaning apparatus 31 can be suppressed.

The control device 70 prohibits the wafer, which is found not to have the deposit 7 as a result of the inspection in the inspection apparatus 32, from being transferred into the cleaning apparatus 31. Thus, the unnecessary cleaning of the wafer without having the deposit 7 in the cleaning apparatus 31 can be suppressed.

Figure 14:
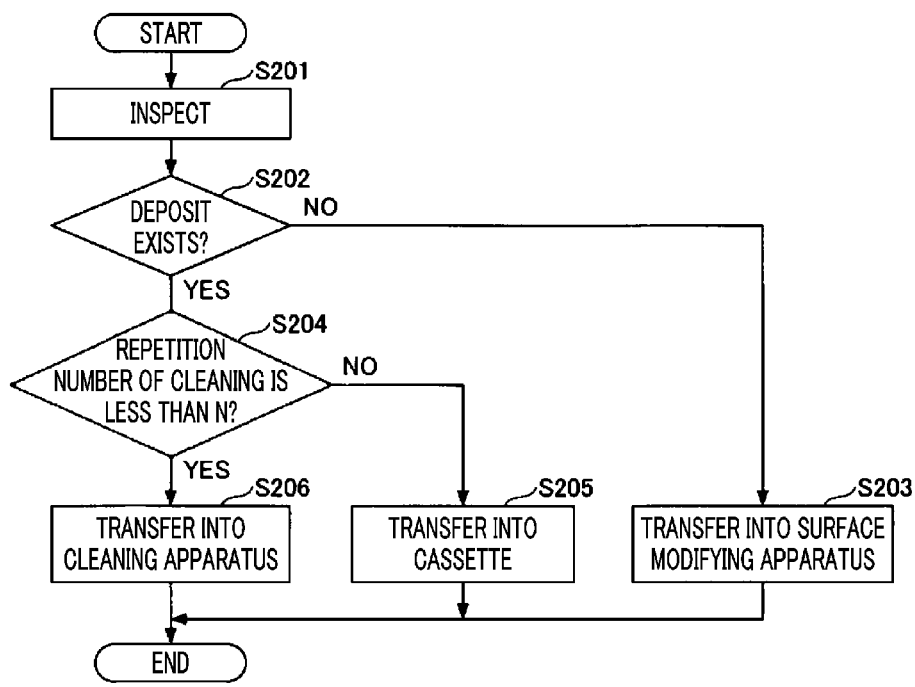
FIG. 14 is a flowchart illustrating a processing of the second substrate based on an inspection result of the inspection apparatus according to the exemplary embodiment.

FIG. 14 is a flowchart illustrating a processing of the second substrate based on an inspection result of the inspection apparatus according the exemplary embodiment. Since the processing of the lower wafer W2 shown in FIG. 14 and a processing of the upper wafer W1 are performed in the same way, illustration of the processing of the upper wafer W1 is omitted. The processings shown in FIG. 14 are performed under the control of the control device 70.

First, the inspection apparatus 32 inspects presence or absence of the deposit 7 adhering to the non-bonding surface W2n of the lower wafer W2 (S201). Then, the control device 70 checks an inspection result of the inspection apparatus 32 (S202).

If no deposit 7 exists (S202, NO), introduction of the deposit 7 into the bonding apparatus 41 does not occur. Thus, the control device 70 transfers the lower wafer W2 into the surface modifying apparatus 33 by the transfer device 61 without transferring it into the cleaning apparatus 31 (S203).

Meanwhile, if the deposit 7 exists (S202, YES), the deposit 7 is introduced into the bonding apparatus 41 if the lower wafer W2 is transferred into the bonding apparatus 41 in this state. Thus, the control device 70 first checks whether a repetition number of the cleaning upon the lower wafer W2, which is subjected to up to the inspection (S201), is less than N (N is a preset integer equal to or larger than 1) (S204). N is previously decided based on a cleaning power of the cleaning apparatus 31.

If the repetition number of the cleaning upon the wafer W2 is equal to or larger than N (S204, NO), there is no more likelihood that the deposit 7 can be removed by the cleaning apparatus 31. Thus, the control device 70 transfers the lower wafer W2 into the cassette C4 by using the transfer devices 61 and 22 (S205).

If the repetition number of the cleaning upon the wafer W2 is less than N (S204, YES), on the other hand, there is still a likelihood that the cleaning apparatus 31 is capable of removing the deposit 7. Thus, the control device 70 transfers the lower wafer W2 into the cleaning apparatus 31 by using the transfer device 61 (S206).

Thereafter, the cleaning apparatus 31 cleans the non-bonding surface W2n of the lower wafer W2. Subsequently, the control device 70 transfers the lower wafer W2 into the inspection apparatus 32 by using the transfer device 61. Then, the processing shown in FIG. 14 is performed again.

As stated above, If the lower wafer W2 is found to have the deposit 7 as a result of the inspection in the inspection apparatus 32, the control device 70 transfers this lower wafer W2 into the cleaning apparatus 31 by using the transfer device 61. Since the deposit 7 can be removed in the cleaning apparatus 31, the number of lower wafers W2 which are wasted away can be reduced.

After transferring the lower wafer W2, which has been found to have the deposit 7 as a result of the inspection in the inspection apparatus 32, into the cleaning apparatus 31 by using the transfer device 61, the control device 70 transfers this lower wafer W2 into the inspection apparatus 32 again. It can be checked in the inspection apparatus 32 whether the deposit 7 can be removed by the cleaning apparatus 31, so the deposit 7 can be surely suppressed from being introduced into the bonding apparatus 41.

If the lower wafer W2 is found not to have the deposit 7 as a result of the inspection in the inspection apparatus 32, the control device 70 transfers this lower wafer W2 into the surface modifying apparatus 33 by using the transfer device 61 without transferring it into the cleaning apparatus 31. Since the deposit 7 is not introduced into the surface modifying apparatus 33, the surface hydrophilizing apparatus 35 and the bonding apparatus 41, contamination of these apparatuses 33, 35 and 41 can be suppressed.

The control device 70 performs the cleaning (S106) and the inspection (S107) of the lower wafer W2 before the surface modification (S108), the surface hydrophilization (S109) and the bonding (S110), as shown in FIG. 13. Since the processing of the bonding surface W2$j$ is begun after the processing of the non-bonding surface W2$n$ is completed, an elapsed time from the surface modification (S108) to the bonding (S110) can be shortened, so that the effects of the surface modification (S108) and the surface hydrophilization (S109) can be suppressed from disappearing before the bonding S110 is begun.

Further, the cleaning (S106) and the inspection (S107) of the lower wafer W2 only needs to be performed before the bonding (S110). By way of example, the cleaning (S106) and the inspection (S107) of the lower wafer W2 may be performed between the surface modification (S108) and the surface hydrophilization (S109), or between the surface hydrophilization (S109) and the bonding (S110). In these cases as well, the deposit 7 can be suppressed from being introduced into the bonding apparatus 41, so that the formation of the void 8 can be suppressed.

Furthermore, the cleaning (S106) of the lower wafer W2 may be performed at the same time as the surface hydrophilization (S109), as will be described later. In this case, the cleaning apparatus 31 is equipped with an embedded cleaning device which is provided within the surface hydrophilizing apparatus 35.

Figure 15:
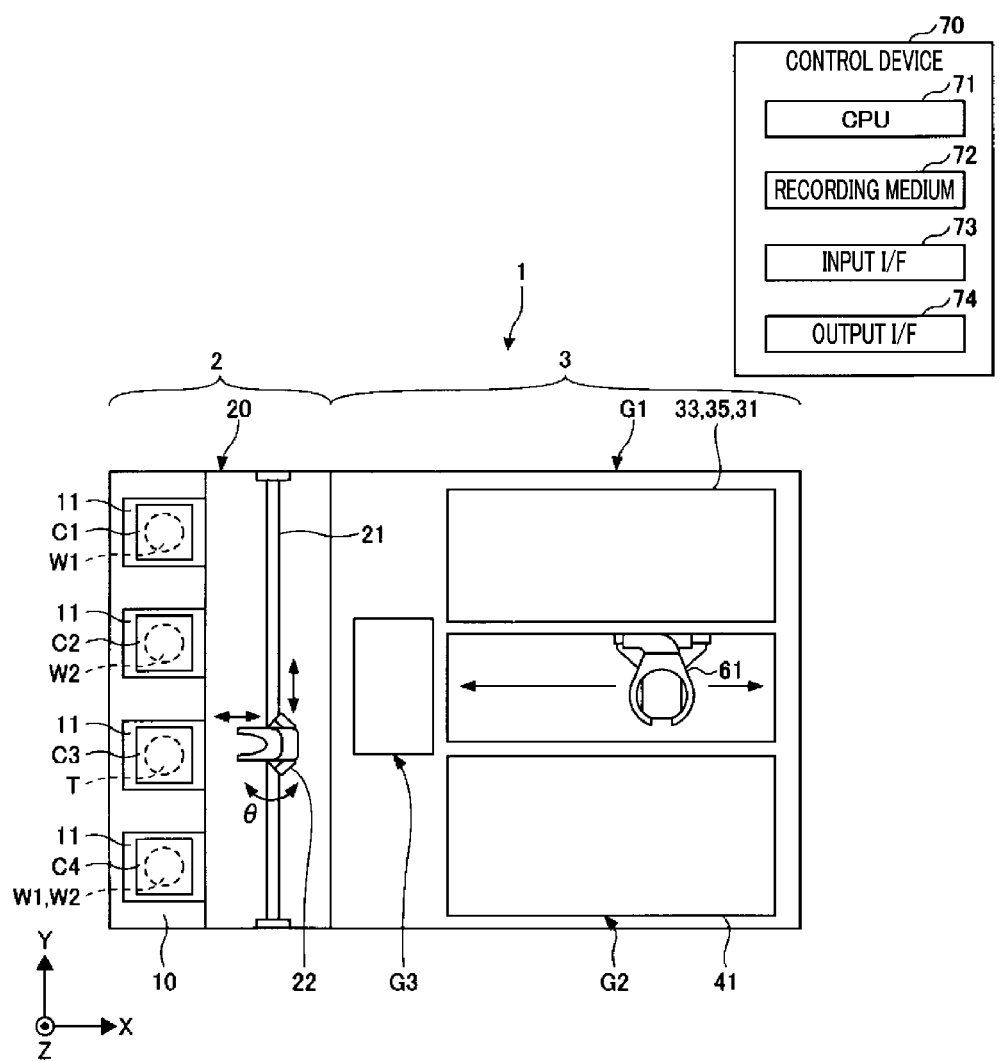
FIG. 15 is a plan view illustrating a bonding system according to a first modification example.
Figure 16:
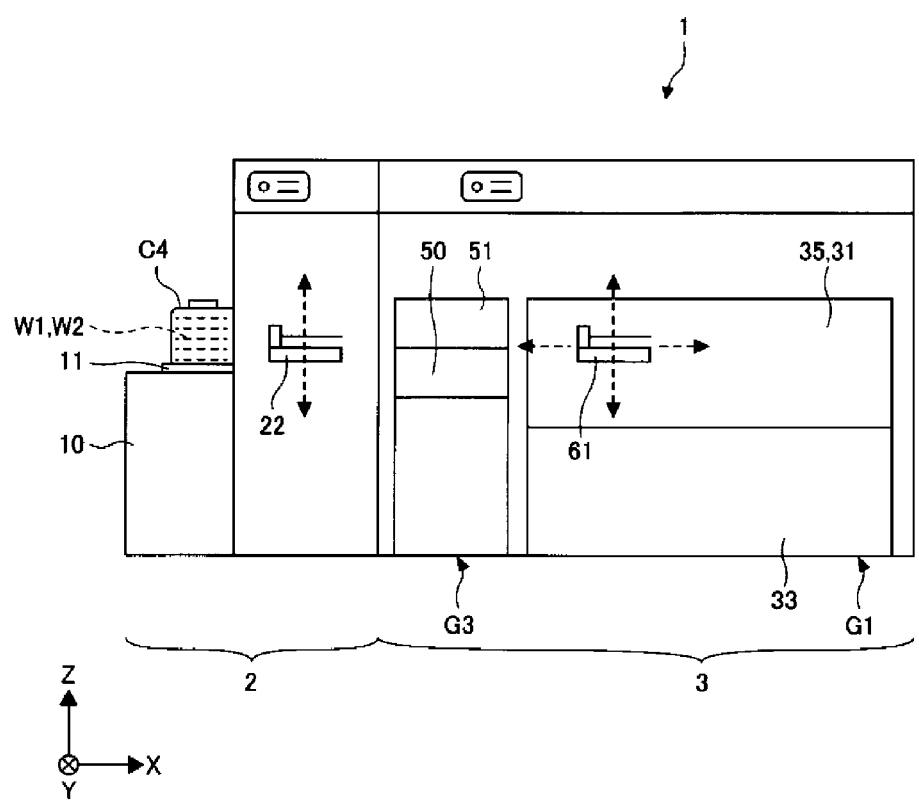
FIG. 16 is a front view illustrating the bonding system according to the first modification example.
Figure 17:
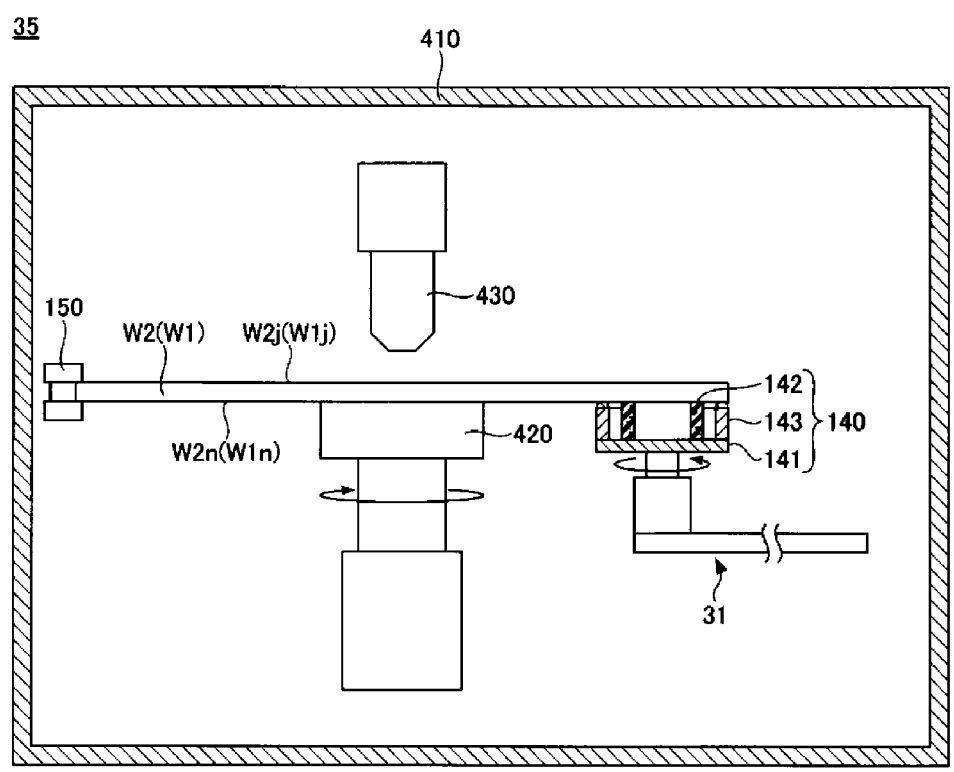
FIG. 17 is a diagram illustrating a surface hydrophilizing apparatus according to the first modification example.

FIG. 15 is a plan view illustrating a bonding system according to a first modification example. FIG. 16 is a front view illustrating the bonding system according to the first modification example. In FIG. 16, to illustrate a positional relationship between the surface modifying apparatus 33 and the surface hydrophilizing apparatus 35, illustration of the bonding apparatus 41 shown in FIG. 15 is omitted. FIG. 17 is a diagram illustrating the surface hydrophilizing apparatus according to the first modification example.

A cleaning apparatus 31 according to the present modification example has an embedded cleaning head 140 which is provided within the surface hydrophilizing apparatus 35. Simply by providing the embedded cleaning head 140 within the apparatus 35, the deposit 7 can be suppressed from being carried into the bonding apparatus 41. Thus, a scale-up of the bonding system 1 can be suppressed. Below, distinctive features of the present modification example from the above-described exemplary embodiment will be mainly explained.

The surface hydrophilizing apparatus 35 is equipped with, for example, a processing vessel 410, a spin chuck 420 and a nozzle 430. Within the processing vessel 410, the spin chuck 420 holds the upper wafer W1 horizontally from below with the bonding surface W1$j$ of the upper wafer W1 facing upwards. Likewise, within the processing vessel 410, the spin chuck 420 holds the lower wafer W2 horizontally from below with the bonding surface W2$j$ of the lower wafer W2 facing upwards.

The nozzle 430 supplies water such as DIW (deionized water) onto the bonding surfaces W1$j$ and W2$j$ from above. The nozzle 430 may be a dual-fluid nozzle configured to discharge a mixture of the water and a gas. The nozzle 430 supplies the water onto the central portions of the bonding surfaces W1$j$ and W2$j$ being rotated along with the spin chuck 420. The supplied water is diffused on the entire bonding surfaces W1$j$ and W2$j$ by the centrifugal force. The nozzle 430 may be moved in the diametrical direction of the bonding surfaces W1$j$ and W2$j$.

The spin chuck 420 holds the central portions of the non-bonding surfaces W1$n$ and W2$n$. Since the peripheral portions of the non-bonding surfaces W1$n$ and W2$n$ are not held by the spin chuck 420, these peripheral portions can be cleaned by being rubbed by the embedded cleaning head 140.

Like the cleaning head 130, the embedded cleaning head 140 is configured to rub the non-bonding surfaces W1$n$ and W2$n$ to clean them. The embedded cleaning head 140 supplies a cleaning liquid such as water onto the non-bonding surfaces W1$n$ and W2$n$ while it is being in contact with the non-bonding surfaces W1$n$ and W2$n$.

Like the cleaning head 130, the embedded cleaning head 140 is equipped with, for example, a base 141 having a disk shape, a cylindrical sponge 142 and a cylindrical polishing member 143. Since the base 141, the sponge 142 and the polishing member 143 are configured the same as the base 131, the sponge 132 and the polishing member 133 of the above-described exemplary embodiment, description thereof will be omitted. Further, like the polishing member 133, the polishing member 143 may also serve as a roughening member configured to roughen the non-bonding surface W2$n$. Furthermore, the polishing member 143 and the roughening member may be provided as separate members, and either one of them may be provided.

Further, the cleaning apparatus 31 according to the present modification example may further include a peripheral cleaning device 150 disposed within the surface hydrophilizing apparatus 35. The peripheral cleaning device 150 cleans the peripheral portion of the upper wafer W1 or the peripheral portion of the lower wafer W2 to clean it. The peripheral cleaning device 150 may be, by way of example, a sponge or a brush. A deposit can be removed from the peripheral portion of the upper wafer W1 or the peripheral portion of the lower wafer W2.

Figure 18:
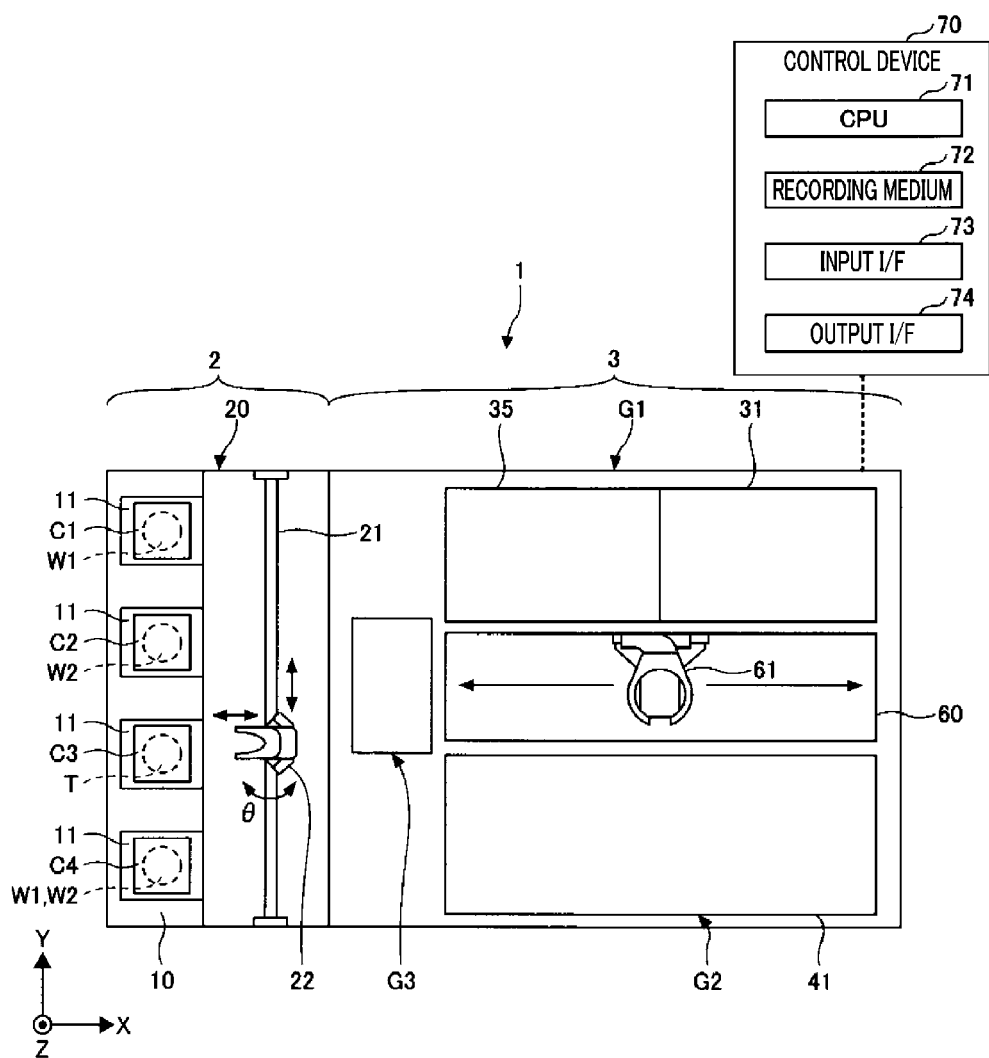
FIG. 18 is a plan view illustrating a bonding system according to a second modification example.
Figure 19:
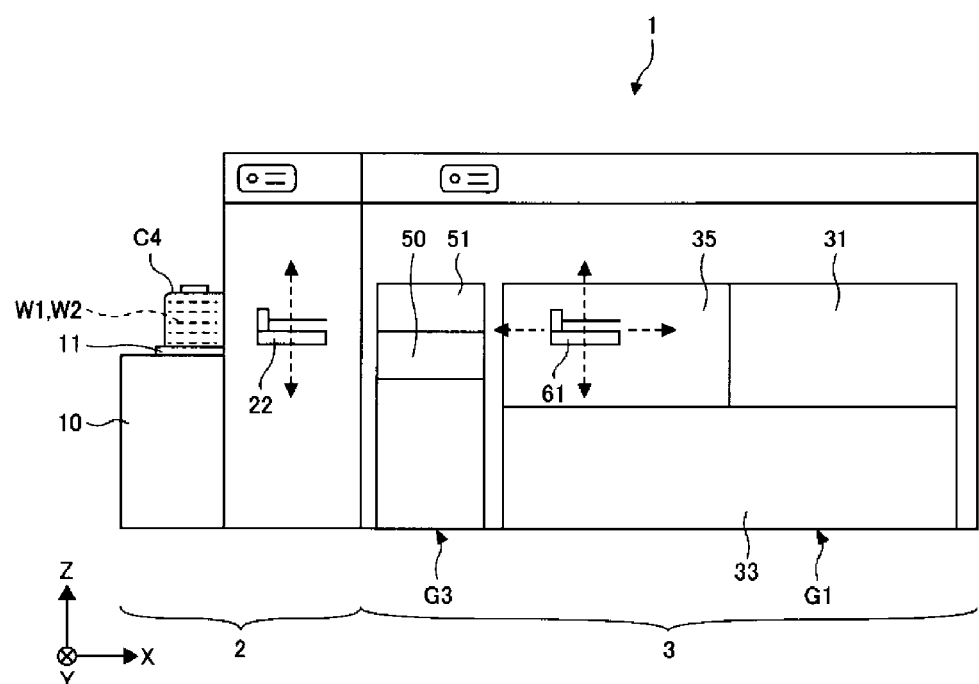
FIG. 19 is a front view illustrating the bonding system according to the second modification example.

FIG. 18 is a plan view illustrating a bonding system according to a second modification example. FIG. 19 is a front view illustrating the bonding system according to the second modification example. In FIG. 19, to illustrate a positional relationship between the surface modifying apparatus 33 and the surface hydrophilizing apparatus 35, illustration of the bonding apparatus 41 shown in FIG. 18 is omitted. A layout of the first processing block G1 is different in the present modification example and the above-described exemplary embodiment. Below, distinctive features of the present modification example from the above-described exemplary embodiment and the like will be mainly explained.

As shown in FIG. 19, the cleaning apparatus 31, the surface modifying apparatus 33 and the surface hydrophilizing apparatus 35 are disposed in the first processing block G1. For example, the cleaning apparatus 31 and the surface hydrophilizing apparatus 35 are disposed on the surface modifying apparatus 33. Further, the kinds and the layout of the apparatuses disposed in the first processing block G1 are not particularly limited. For example, the cleaning apparatus 31 and the surface hydrophilizing apparatus 35 may be disposed under the surface modifying apparatus 33.

As depicted in FIG. 19, the cleaning apparatus 31 and the surface hydrophilizing apparatus 35 are provided separately and arranged in the X-axis direction. However, the present disclosure is not limited thereto. As shown in FIG. 17, the cleaning apparatus 31 may be disposed within the surface hydrophilizing apparatus 35. In such a case, the surface hydrophilizing apparatus 35 for the upper wafer W1 and the surface hydrophilizing apparatus 35 for the lower wafer W2 may be installed separately and arranged in the X-axis direction. Since the number of the surface hydrophilizing apparatuses 35 can be increased, the throughput can be improved.

Further, the layout of the surface modifying apparatus 33 may be the same as that of the surface hydrophilizing apparatus 35. That is, the surface modifying apparatus 33 for the upper wafer W1 and a surface modifying apparatus 33 for the lower wafer W2 may be provided separately.

Figure 20:
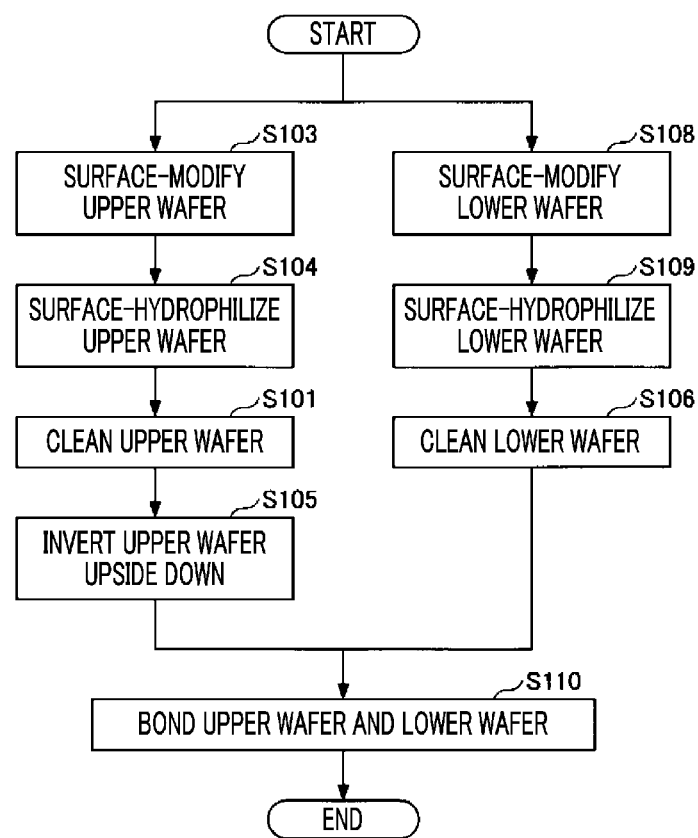
FIG. 20 is a flowchart illustrating major processes of a bonding method according to the second modification example.

FIG. 20 is a flowchart illustrating major processes of a bonding method according to the second modification example. The various processes shown in FIG. 20 are performed under the control of the control device 70. Below, distinctive features between FIG. 20 and FIG. 13 will be mainly explained.

As shown in FIG. 20, the cleaning (S101) of the upper wafer W1 may be performed before the bonding (S110) of the upper wafer W1 and the lower wafer W2 is performed and after the surface hydrophilization (S104) of the upper wafer W1 is completed. Since the cleaning (S101) is performed immediately before the bonding (S110), the introduction of the deposit into the bonding apparatus 41 can be suppressed, so that the problem that might be caused in the bonding processing can be resolved.

Further, in FIG. 20, the inspection (S102) upon the upper wafer W1 shown in FIG. 13 is not performed. However, the inspection (S102) may be performed. Like the cleaning (S101), the inspection (S102) may be performed before the bonding (S110) is performed and after the surface modification (S104) is completed. Since the inspection (S102) is performed immediately before the bonding (S110), the introduction of the deposit into the bonding apparatus 41 can be suppressed, so that the problem that might be caused in the bonding processing can be resolved. An order of the inspection (S102) and the cleaning (S101) is not particularly limited, and either of them may be performed first.

Furthermore, as illustrated in FIG. 20, the cleaning (S106) of the lower wafer W2 may be performed before the bonding (S110) of the upper wafer W1 and the lower wafer W2 is performed and after the completion of the surface hydrophilization (S109) of the lower wafer W2. Since the cleaning (S106) is performed immediately before the bonding (S110), introduction of a deposit into the bonding apparatus 41 can be suppressed, so that a problem that might be caused in the bonding processing can be resolved.

Moreover, in FIG. 20, the inspection (S107) upon the lower wafer W2 shown in FIG. 13 is not performed. However, the inspection (S107) may be performed. Like the cleaning (S106), the inspection (S107) may be performed before the bonding S110 and after the surface hydrophilization (S109) is completed. Since the inspection (S107) is performed immediately before the bonding (S110), the introduction of the deposit into the bonding apparatus 41 can be suppressed, so that the problem that might be caused in the bonding processing can be resolved. An order of the inspection (S107) and the cleaning (S106) is not particularly limited, and either of them may be performed first.

So far, the bonding system and the bonding method according to the exemplary embodiment of the present disclosure have been described. However, the present disclosure is not limited to the above-described exemplary embodiment and the like. Various changes, modifications, substitutions, additions, deletions and combinations may be made within the scope of the claims, which are all incorporated within a technical scope of the present disclosure.

Although the bonding system 1 according to the above-described exemplary embodiment is equipped with both the cleaning apparatus 31 and the inspection apparatus 32, either one of them may be provided. If the bonding system 1 is equipped with at least one of the cleaning apparatus 31 and the inspection apparatus 32, the introduction of the deposit 7 into the bonding apparatus 41 can be suppressed. Thus, the formation of the void 8 can be suppressed when the bonding processing is performed.

In case that the bonding system 1 is equipped with the inspection apparatus 32 without having the cleaning apparatus 31, the upper wafer W1 or the lower wafer W2 found to have the deposit 7 as a result of the inspection in the inspection apparatus 32 is collected into the cassette C4. The collected upper wafer W1 or lower wafer W2 may be returned back into the bonding system 1 after being cleaned at the outside of the bonding system 1, or may be wasted away.

In the above-described exemplary embodiment, the upper wafer W1 corresponds to the first substrate, and the lower wafer W2 corresponds to the second substrate. However, the upper wafer W1 may correspond to the second substrate, and the lower wafer W2 may correspond to the first substrate. Further, though the first and second substrates are semiconductor substrates in the above-described exemplary embodiment, they may be glass substrates or the like.

According to the exemplary embodiment, it is possible to suppress formation of the void between the first substrate and the second substrate when the first substrate and the second substrate are bonded.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting. The scope of the inventive concept is defined by the following claims and their equivalents rather than by the detailed description of the exemplary embodiments. It shall be understood that all modifications and embodiments conceived from the meaning and scope of the claims and their equivalents are included in the scope of the inventive concept.

The claims of the present application are different and possibly, at least in some aspects, broader in scope than the claims pursued in the parent application. To the extent any prior amendments or characterizations of the scope of any claim or cited document made during prosecution of the parent could be construed as a disclaimer of any subject matter supported by the present disclosure, Applicants hereby rescind and retract such disclaimer. Accordingly, the references previously presented in the parent applications may need to be revisited.

We claim:

1. A bonding method, comprising:
modifying a bonding surface of a first substrate and a bonding surface of a second substrate;

hydrophilizing the modified bonding surface of the first substrate and the modified bonding surface of the second substrate;

bonding the hydrophilized bonding surface of the first substrate and the hydrophilized bonding surface of the second substrate in a state that the bonding surfaces face each other; and cleaning, before the bonding is performed, a non-bonding surface opposite to the bonding surface of, between the first substrate and the second substrate, at least one which is maintained flat when the bonding is performed.

2. The bonding method of claim 1, wherein the cleaning comprises polishing the non-bonding surface.

3. The bonding method of claim 1, wherein the cleaning comprises roughening the non-bonding surface.

4. The bonding method of claim 3, wherein the cleaning comprises roughening the non-bonding surface of, between the first substrate and the second substrate, one which is deformed when the bonding is performed, except a peripheral portion thereof.

5. The bonding method of claim 1, wherein the cleaning comprises cleaning a peripheral portion of the non-bonding surface.

6. The bonding method of claim 1, further comprising:

inspecting, before the bonding is performed, presence or absence of a deposit adhering to the non-bonding surface.

7. The bonding method of claim 6, wherein the cleaning is performed before the inspecting.

8. The bonding method of claim 6, wherein the cleaning is performed after the inspecting.

9. The bonding method of claim 6, further comprising:

cleaning the non-bonding surface which is found to have the deposit as a result of the inspecting.

* * * * *

UNITED STATES PATENT AND TRADEMARK OFFICE
CERTIFICATE OF CORRECTION

| | |
|---|---|
| PATENT NO. | : 11,626,302 B2 |
| APPLICATION NO. | : 17/813369 |
| DATED | : April 11, 2023 |
| INVENTOR(S) | : Yuji Mimura et al. |

It is certified that error appears in the above-identified patent and that said Letters Patent is hereby corrected as shown below:

In the Specification

Column 5, Line 18, "can e" should be -- can be --.

Column 9, Line 53, "Gi" should be -- G1 --.

Column 13, Line 32, "sysem" should be -- system --.

Signed and Sealed this
Second Day of January, 2024

Katherine Kelly Vidal
*Director of the United States Patent and Trademark Office*